United States Patent
Lee et al.

(10) Patent No.: US 11,417,652 B2
(45) Date of Patent: Aug. 16, 2022

(54) SEMICONDUCTOR DEVICE WITH A CONTACT PLUG ADJACENT A GATE STRUCTURE

(71) Applicant: Samsung Electronics Co., Ltd., Suwon-si (KR)

(72) Inventors: In-Keun Lee, Hwaseong-si (KR); Jong-Chul Park, Seongnam-si (KR); Sang-Hyun Lee, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 34 days.

(21) Appl. No.: 16/360,191

(22) Filed: Mar. 21, 2019

(65) Prior Publication Data

US 2019/0333915 A1    Oct. 31, 2019

(30) Foreign Application Priority Data

Apr. 26, 2018  (KR) ........................ 10-2018-0048349

(51) Int. Cl.
| | | |
|---|---|---|
| *H01L 27/088* | (2006.01) | |
| *H01L 29/66* | (2006.01) | |
| *H01L 29/78* | (2006.01) | |
| *H01L 21/768* | (2006.01) | |
| *H01L 21/8234* | (2006.01) | |

(52) U.S. Cl.
CPC .... *H01L 27/0886* (2013.01); *H01L 21/76832* (2013.01); *H01L 21/76897* (2013.01); *H01L 21/823431* (2013.01); *H01L 21/823437* (2013.01); *H01L 21/823468* (2013.01); *H01L 21/823475* (2013.01); *H01L 29/66545* (2013.01); *H01L 29/66795* (2013.01); *H01L 29/7851* (2013.01)

(58) Field of Classification Search
CPC ........... H01L 27/0886; H01L 21/76832; H01L 21/76897; H01L 21/823431; H01L 21/823437; H01L 21/823468; H01L 21/823475; H01L 21/66545; H01L 29/66795; H01L 29/785; H01L 29/66785
USPC ........................................................ 257/368
See application file for complete search history.

(56) References Cited

U.S. PATENT DOCUMENTS

| | | | |
|---|---|---|---|
| 6,238,971 B1 | 5/2001 | Parekh et al. | |
| 8,524,592 B1 * | 9/2013 | Xie | ......................... H01L 29/78 |
| | | | 257/387 |
| 9,679,991 B2 | 6/2017 | Jun et al. | |
| 9,805,934 B2 | 10/2017 | Jen et al. | |
| 9,824,920 B2 | 11/2017 | Park et al. | |
| 9,825,049 B2 | 11/2017 | Hosoda et al. | |

(Continued)

FOREIGN PATENT DOCUMENTS

KR    10-2012-0098295       9/2012

*Primary Examiner* — Lex H Malsawma
*Assistant Examiner* — Eric W Jones
(74) *Attorney, Agent, or Firm* — Myers Bigel, P.A.

(57) ABSTRACT

A semiconductor device includes a substrate, a gate structure on the substrate, a first etch stop layer, a second etch stop layer, and an interlayer insulation layer that are stacked on the gate structure, and a contact plug penetrating the interlayer insulation layer, the second etch stop layer, and the first etch stop layer and contacting a sidewall of the gate structure. The contact plug includes a lower portion having a first width and an upper portion having a second width. A lower surface of the contact plug has a stepped shape.

20 Claims, 31 Drawing Sheets

(56) References Cited

U.S. PATENT DOCUMENTS

| | | | |
|---|---|---|---|
| 2008/0166863 A1* | 7/2008 | Furukawa | H01L 21/28114 438/586 |
| 2009/0146296 A1* | 6/2009 | Ye | H01L 21/76895 257/734 |
| 2012/0161238 A1* | 6/2012 | Scheiper | H01L 21/823431 257/368 |
| 2014/0252424 A1* | 9/2014 | Cai | H01L 21/823821 257/288 |
| 2014/0264486 A1* | 9/2014 | Pham | H01L 29/66545 257/288 |
| 2016/0027901 A1* | 1/2016 | Park | H01L 21/823821 257/288 |
| 2016/0035857 A1* | 2/2016 | Leobandung | H01L 29/665 257/288 |
| 2017/0236918 A1 | 8/2017 | Basker et al. | |
| 2017/0372956 A1 | 12/2017 | Cheng et al. | |
| 2017/0372957 A1 | 12/2017 | Cheng et al. | |
| 2018/0040615 A1* | 2/2018 | Chang | H01L 27/0886 |

\* cited by examiner

1ST DIRECTION ⊗   2ND DIRECTION →

SEMICONDUCTOR DEVICE WITH A CONTACT PLUG ADJACENT A GATE STRUCTURE

CROSS-REFERENCE TO RELATED APPLICATION

This application claims priority under 35 U.S.C. § 119 to Korean Patent Application No. 10-2018-0048349 filed on Apr. 26, 2018 in the Korean Intellectual Property Office, the disclosure of which is hereby incorporated by reference in its entirety.

BACKGROUND

Example embodiments of the present disclosure relate to a semiconductor device, and more specifically, to a semiconductor memory device including a contact plug.

A contact plug of a semiconductor device is formed to be self-aligned with a gate spacer of a gate structure in which a metal gate electrode and a capping pattern that is sequentially stacked and the gate spacer is formed on the sidewall thereof. However, as a thickness of the capping pattern may be increased to prevent an electrical short between the metal gate electrode and the contact plug from occurring due to a misalignment, a size of the gate structure is increased.

SUMMARY

According to example embodiments of the inventive concepts, a semiconductor device may include a substrate, a gate structure on the substrate, a first etch stop layer, a second etch stop layer, and an interlayer insulation layer that are stacked on the gate structure, and a contact plug penetrating the interlayer insulation layer, the second etch stop layer, and the first etch stop layer. The contact plug contacts a sidewall of the gate structure. The contact plug may include a lower portion having a first width and an upper portion having a second width that is greater than the first width. A lower surface of the contact plug may have a stepped shape.

According to example embodiments of the inventive concepts, a semiconductor device may include a substrate, a gate structure on the substrate, a first source/drain layer and a second source/drain layer on the substrate adjacent to a first sidewall and a second sidewall, respectively, of the gate structure, a first interlayer insulation layer on the substrate and the first and second source/drain layers, a first etch stop layer, a second etch stop layer, and a second interlayer insulation layer that are sequentially stacked on the gate structure and the first interlayer insulation layer, and a first contact plug and a second contact plug on the first source/drain layer and the second source/drain layer, respectively, and penetrating the second interlayer insulation layer, the second etch stop layer, the first etch stop layer, and the first interlayer insulation layer. The first contact plug directly may contact the first sidewall of the gate structure and a portion of an upper surface of the gate structure adjacent to the first sidewall thereof. The second contact plug may be spaced apart from the second sidewall of the gate structure by the first interlayer insulation layer.

According to example embodiments of the inventive concepts, a semiconductor device may include a substrate, a first gate structure and a second gate structure on the substrate, a source/drain layer on the substrate between the first gate structure and the second gate structure, and a contact plug on the source/drain layer. Each of the first gate structure and the second gate structure may include a gate electrode, a gate insulation pattern on a sidewall and a lower surface of the gate electrode, a gate spacer on a sidewall of the gate insulation pattern, and a capping pattern on the gate electrode, the gate insulation pattern, and the gate spacer. The contact plug may contact a sidewall of the gate spacer of the first gate structure, a sidewall and a portion of an upper surface of the capping pattern of the first gate structure, a sidewall of the gate spacer of the second gate structure, and a sidewall of the capping pattern of the second gate structure and may have a lower surface having a stepped shape.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Various example embodiments will now be described more fully with reference to the accompanying drawings in which some example embodiments are shown. However, the inventive concepts may be embodied in many alternate forms and should not be construed as limited to the example embodiments set forth herein.

Figure 1:
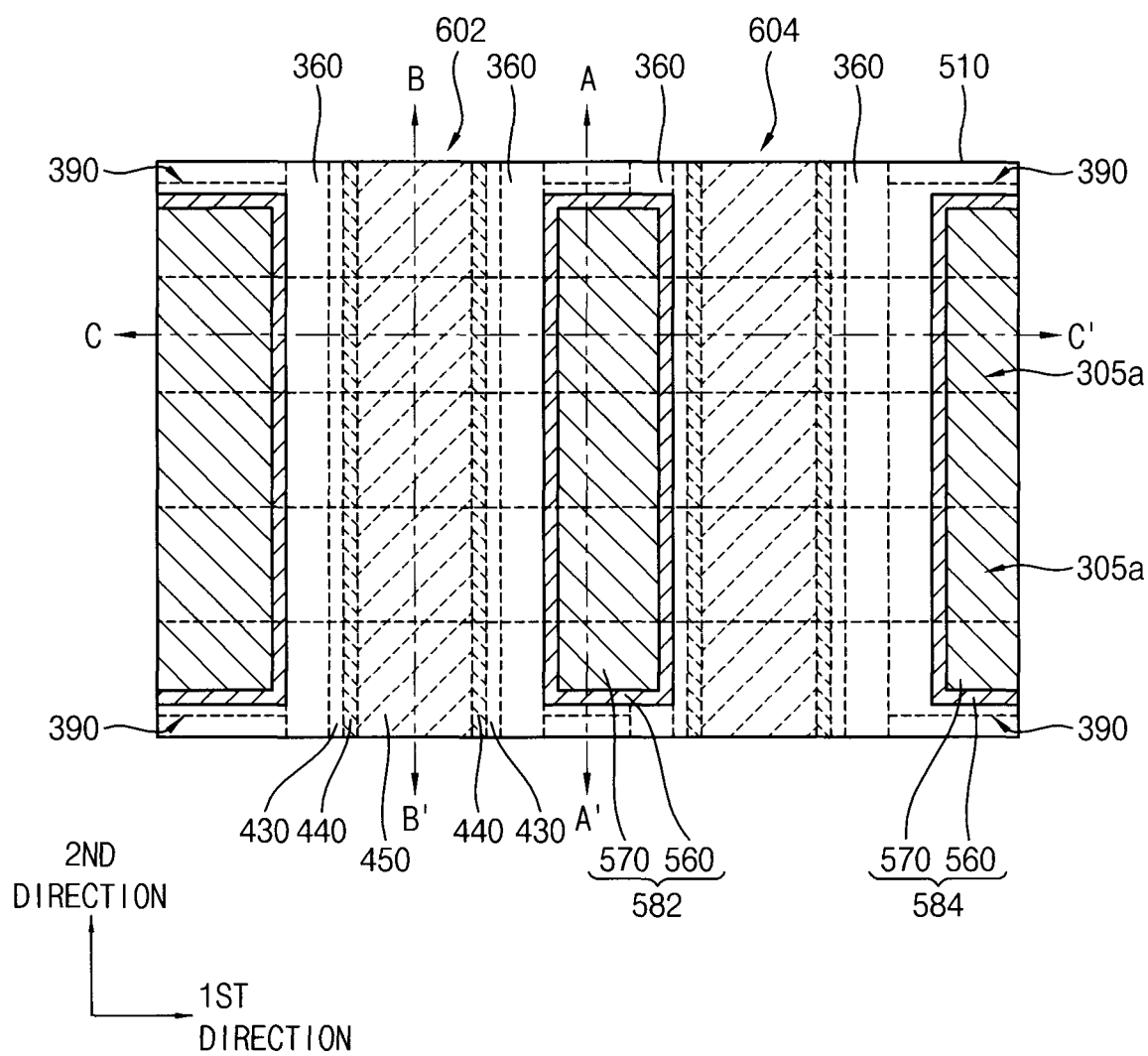
FIGS. 1 to 4 are a planar view and cross-sectional views illustrating a semiconductor device according to some embodiments of the present inventive concept.
Figure 2:
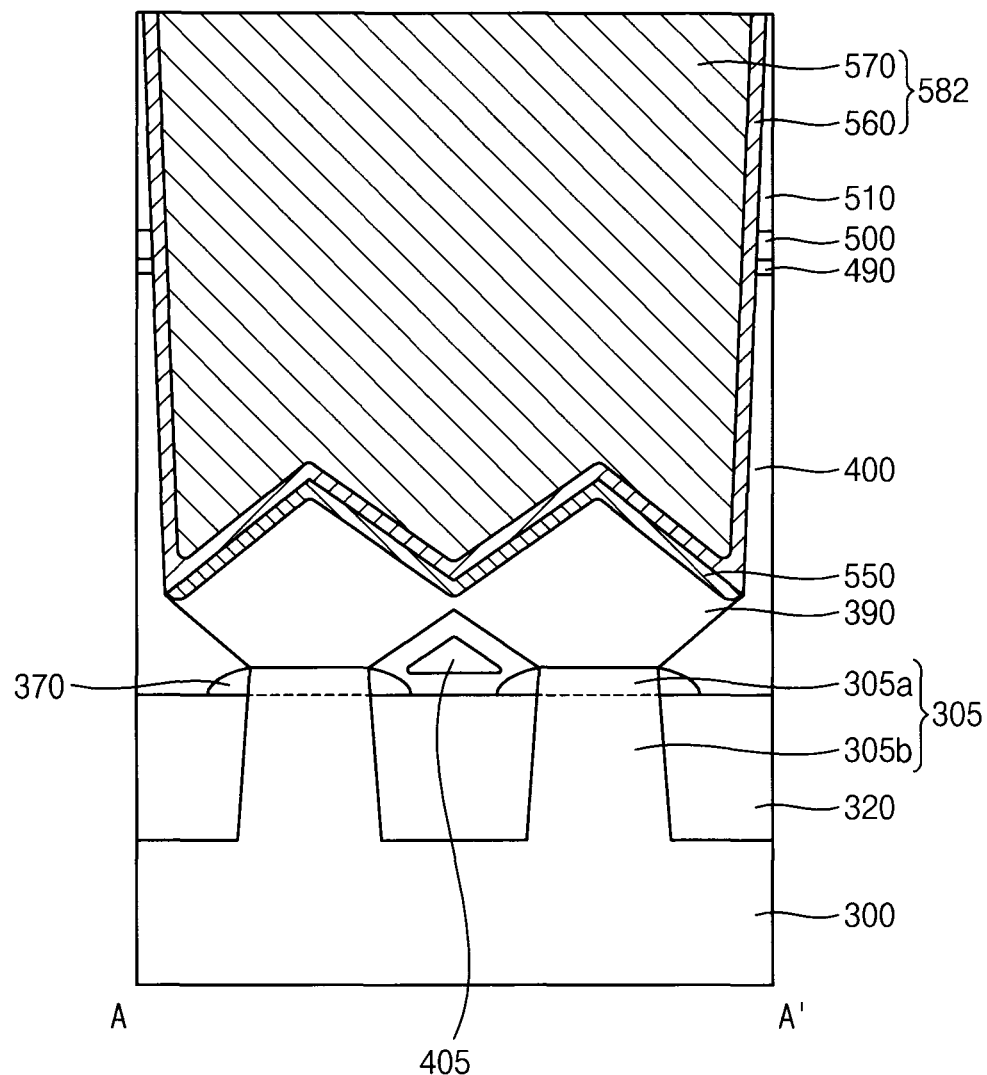
Figure 3:
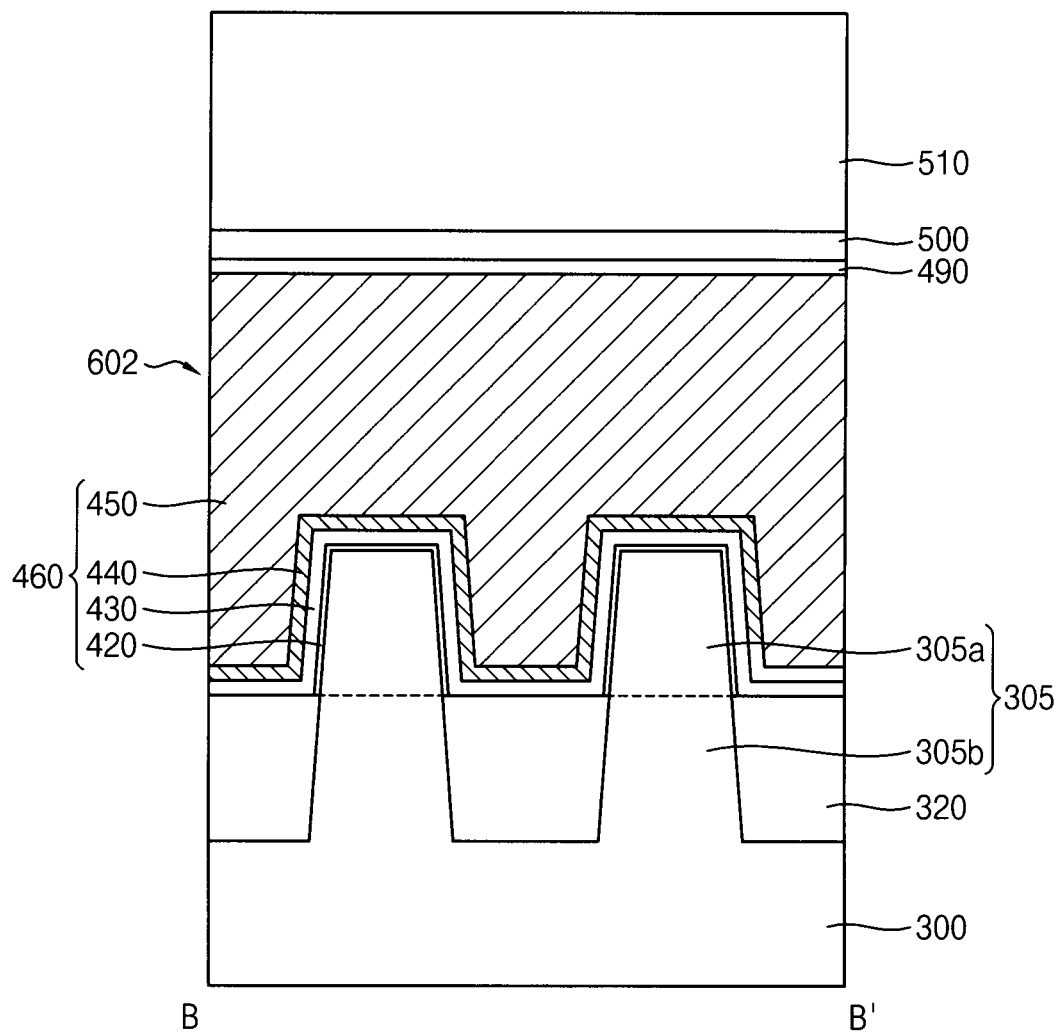
Figure 4:
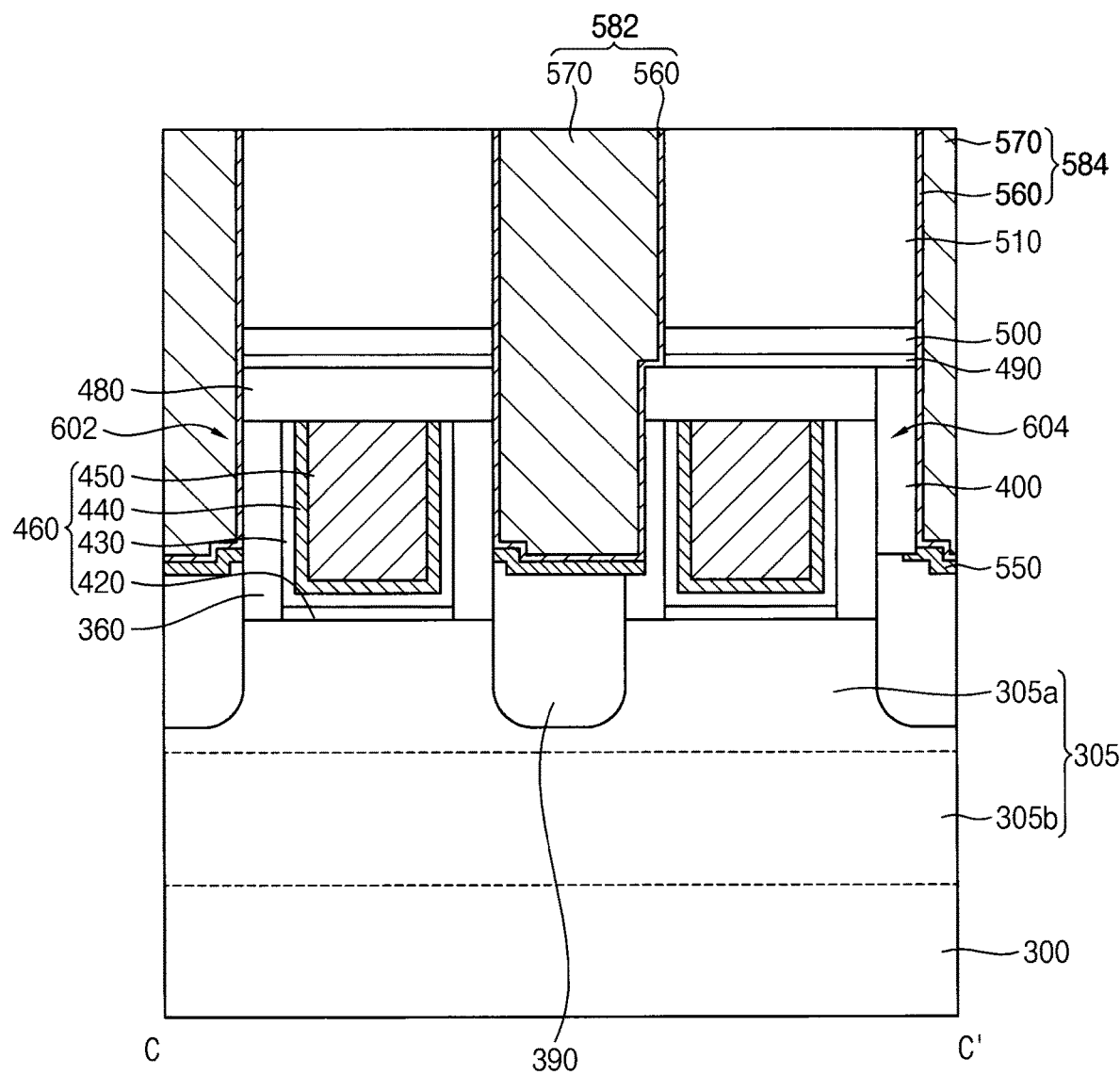
Figure 5:
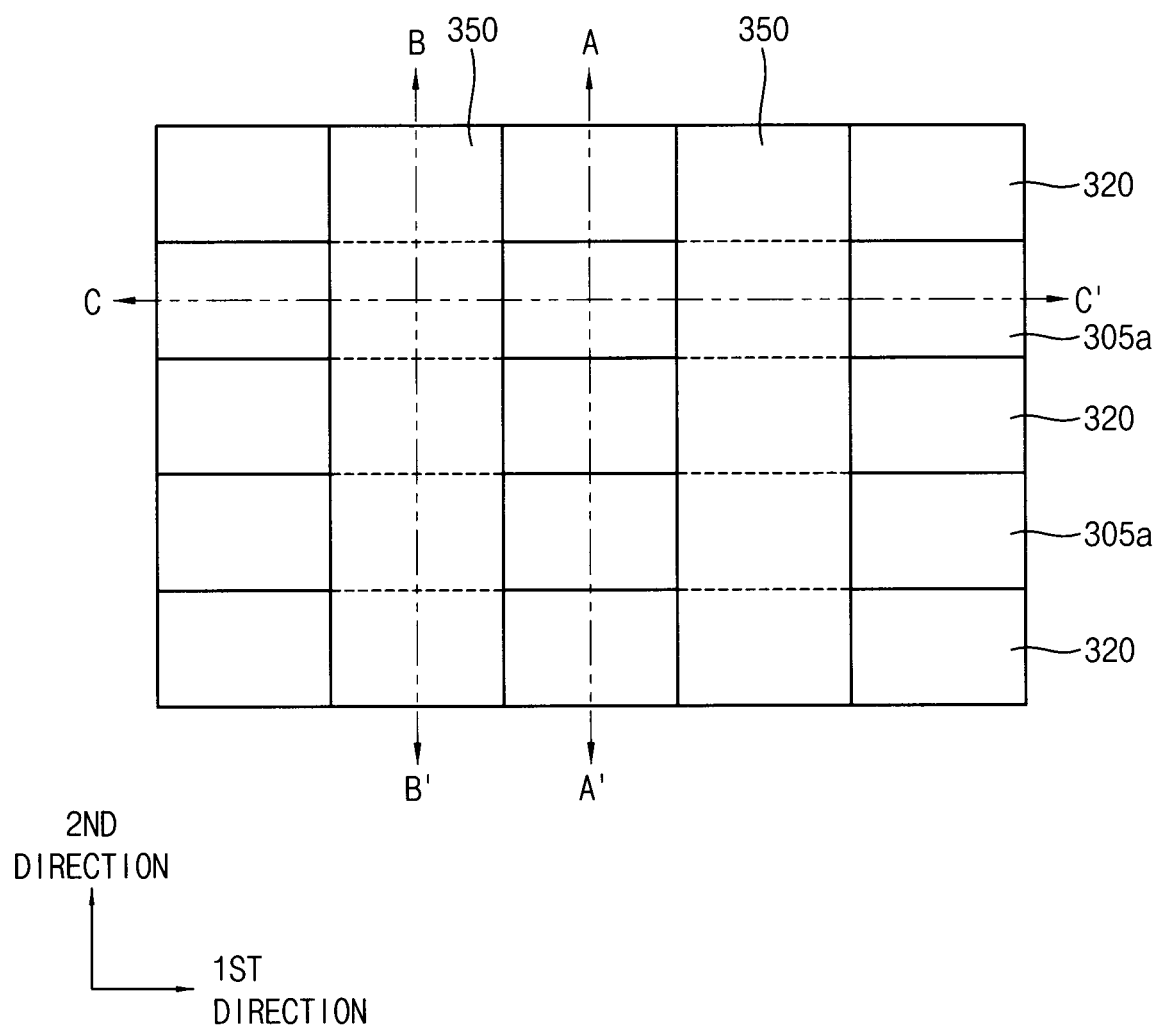
FIGS. 5 to 24 are planar views and cross-sectional views illustrating stages in a method of manufacturing a semiconductor device according to some embodiments of the present inventive concept.

FIGS. 1 to 4 are a planar view and cross-sectional views illustrating a semiconductor device according to example embodiments. FIG. 1 is a planar view. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1.

Referring to FIGS. 1 to 4, a semiconductor device may include a substrate 300, a gate structure, a source/drain layer 390, first and second etch stop layers 490 and 500, first and second interlayer insulation layers 400 and 510, and a contact plug 582/584. It will be understood that, although the terms first, second, third, etc. may be used herein to describe various elements, and elements should not be limited by these terms; rather, these terms are only used to distinguish one element from another element. Thus, a first element discussed below could be termed a second element without departing from the scope of the present inventive concepts.

The substrate 300 may include silicon, germanium, silicon-germanium, or a group III-V compound semiconductor, such as GaP, GaAs, or GaSb. In some embodiments, the substrate 300 may be a silicon on insulator (SOI) substrate or a germanium on insulator (GOI) substrate.

A device isolation pattern 320 may be formed on the substrate 300. An active region 305 of which a lower sidewall is covered by the device isolation pattern 320 may be defined to protrude upward. The device isolation pattern 320 may include oxide, e.g., silicon oxide.

The active region 305 may have a fin-shape, and thus refers to an active fin 305. The active fin 305 may extend in a first direction parallel to an upper surface of the substrate 300. A plurality of active fins 305 may be arranged in a second direction crossing the first direction and parallel to the upper surface of the substrate 300. In some embodiments, the first direction may be perpendicular to the second direction.

Each of the active fins 305 may include a lower active pattern 305b of which a sidewall is covered by the device isolation pattern 320 and an upper active pattern 305a protruding above an upper surface of the device isolation pattern 320. A portion of the substrate 300, in which the active region 305 is not formed, may be referred to as a field region.

The gate structure may include a gate electrode structure 460, a gate spacer 360 on a sidewall of the gate electrode structure 460, and a first capping pattern 480 on (or covering) an upper surface of the gate electrode structure 460 and an upper surface of the gate spacer 360.

In some embodiments, the gate structure may extend in the second direction. A plurality of gate structures may be arranged to be spaced apart from each other in the first direction. As an example, a first gate structure 602 and a second gate structure 604 that are spaced apart from each other in the first direction are illustrated in FIGS. 1 to 4.

In some embodiments, the gate electrode structure 460 may extend in the second direction. The gate electrode structure 460 may include an interface pattern 420, a gate insulation pattern 430, a work function control pattern 440, and a gate electrode 450 that are sequentially stacked on the active fin 305 and the device isolation pattern 320.

The interface pattern 420 may be formed on only the active fin 305 or on the active fin 305 and the device isolation pattern 320. A lower surface and a sidewall of the gate electrode 450 may be covered by the work function control pattern 440. The gate insulation pattern 430 may cover a lower surface and a sidewall of the work function control pattern 440.

The interface pattern 420 may include oxide, e.g., silicon oxide. The gate insulation pattern 430 may include a high-k dielectric material, e.g., hafnium oxide ($HfO_2$), tantalum oxide ($Ta_2O_5$), or zirconium oxide ($ZrO_2$). The work function control pattern 440 may include metal nitride or metal alloy, e.g., titanium nitride (TiN), titanium aluminum (TiAl), titanium aluminum nitride (TiAlN), tantalum nitride (TaN), tantalum aluminum nitride (TaAlN). The gate electrode 450 may include low resistive metal, e.g., aluminum (Al), copper (Cu), or tantalum (Ta), or nitride thereof.

The gate spacer 360 may cover each of opposite sidewalls of the gate electrode structure 460 in the first direction. Each of opposite sidewalls in the second direction of the upper active pattern 305a of each active fin 305 may be covered by a fin spacer 370. The gate spacer 360 and the fin spacer 370 may include nitride, e.g., silicon nitride. In some embodiments, each of the gate spacer 360 and the fin spacer 370 may include multiple stacked layers, each of which includes nitride and/or oxide.

The first capping pattern 480 may include nitride, e.g., silicon nitride.

The source/drain layer 390 may be formed on the active fin 305 between the gate structures, and an upper portion of the source/drain layer 390 may contact a sidewall of the gate spacer 360. In some embodiments, the source/drain layer 390 may have a cross section, taken along the second direction, which has a shape similar to a pentagonal shape.

In some embodiments, when a distance between adjacent active fins 305 in the second direction is small, the source/drain layers 390 grown from respective ones of the active fins 305 may be connected to each other to be merged. In FIG. 2, it is illustrated that two source/drain layers 390 grown from respective ones of two active fins 305 adjacent to each other in the second direction are merged with each other. However, the inventive concepts are not limited thereto. For example, any plurality of source/drain layers 390 may be merged with each other.

In some embodiments, the source/drain layer 390 may include a p-type impurity doped monocrystalline silicon-germanium layer. The source/drain layer 390 may act as a source/drain region of a PMOS transistor.

In some embodiments, the source/drain layer 390 may include a monocrystalline silicon layer or a monocrystalline silicon carbide layer, which is doped with an n-type impurity. The source/drain layer 390 may act as a source/drain region of an NMOS transistor.

The first interlayer insulation layer 400 may be formed on substrate 300 to cover the sidewall of the gate structure and the source/drain layer 390. The first interlayer insulation layer 400 may not completely fill a space between the merged source/drain layers 390 and the device isolation pattern 320, such that an air-gap 405 may be formed. The first interlayer insulation layer 400 may include silicon oxide, e.g., Tonen SilaZane (TOSZ).

The first and second etch stop layers 490 and 500 may be sequentially stacked on the gate structure and the first interlayer insulation layer 400. The first etch stop layer 490 may include oxide, e.g., silicon oxide. The second etch stop layer 500 may include nitride, e.g., silicon nitride.

The second interlayer insulation layer 510 may be formed on the second etch stop layer 500. The second interlayer insulation layer 510 may include oxide, e.g., silicon oxide.

The contact plug may penetrate the second interlayer insulation layer 510, the first and second etch stop layers 490 and 500, and the first interlayer insulation layer 400 between the adjacent gate structures in the first direction and may contact an upper surface of the source/drain layer 390. Hereinafter, the contact plug formed between the first and second gate structures 602 and 604, e.g., the contact plug adjacent to a first sidewall of the second gate structure 604 facing the first gate structure 602, refers to a first contact plug 582, and the contact plug adjacent to a second sidewall of the second gate structure 604 opposite to the first sidewall thereof refers to a second contact plug 584. Each of the first and second contact plugs 582 and 584 may include a metal pattern 570 and a barrier pattern 560 covering a lower surface and a sidewall of the metal pattern 570.

In some embodiments, the contact plugs may be self-aligned with the sidewalls of the gate structures. For example, the first contact plug 582 may contact the facing sidewalls of the first and second gate structures 602 and 604. However, a misalignment may occur during the formation of the contact plugs. Thus, for example, the second contact plug 584 may not contact the second sidewall of the second gate structure 604, and the first interlayer insulation layer 400 may remain between the second contact plug 584 and the second gate structure 604.

The first contact plug 582 may have a first sidewall contacting the sidewall of the first gate structure 602 and a second sidewall contacting the first sidewall of the second gate structure 604. In some embodiments, the first sidewall of the first contact plug 582 may have a slope, e.g., a vertical slope, with respect to the upper surface of the substrate 300 regardless of a height thereof. The second sidewall of the first contact plug 582 may be bent at a height level of an upper surface of the second gate structure 604 and may have a slope, e.g., a vertical slope, with respect to the upper surface of the substrate 300, below the height level of the upper surface of the second gate structure 604, like the first sidewall of the first contact plug 582.

Thus, the first contact plug 582 may include an upper portion positioned equal to or above the height level of the upper surface of the second gate structure 604 and a lower portion positioned below the height level of the upper surface of the second gate structure 604. In some embodiments, a width of the upper portion of the first contact plug 582 may be greater than a width of the lower portion of the first contact plug 582. This may be because an edge lower surface or a lower sidewall of the upper portion of the first contact plug 582 contacts a portion of an upper surface (e.g., edge upper surface) or an upper sidewall of the second gate structure 604.

A lower surface of the first contact plug 582 may have a portion adjacent to the first gate structure 602 higher than another portion adjacent to the second gate structure 604. Thus, the lower surface of the first contact plug 582 may have a stepped shape.

According to example embodiments, since each contact structure (i.e., each contact plug) self-aligned with the sidewall of each gate structure may be spaced a sufficient distance apart from the gate electrode structure 460 of each gate structure, and an electrical short between each contact structure and each gate structure may be prevented from occurring. In this regard, hereinafter, it will be described in detail in a method of manufacturing the semiconductor device to be described with reference to FIGS. 5 to 24.

In addition, the lower portion of each contact structure may have the vertical sidewall with respect to the upper surface of the substrate 300, and thus the width of the lower portion thereof may not be decreased in a direction approaching the substrate 300. Accordingly, since a contact area between each contact structure and the source/drain layer 390 is not reduced, a contact resistance therebetween may be prevented from increasing.

A metal silicide pattern 550 may be further formed between each contact plug and the source/drain layer 390. The metal silicide pattern 550 may include metal silicide, e.g., titanium silicide, cobalt silicide, or nickel silicide.

In some embodiments, the metal silicide pattern 550 below the first contact plug 582 may have an upper surface having a stepped shape. Additionally, the metal silicide pattern 550 below the second contact plug 584 may be partly formed (or may be present) below the first interlayer insulation layer 400 adjacent to the second contact plug 584.

Figure 6:
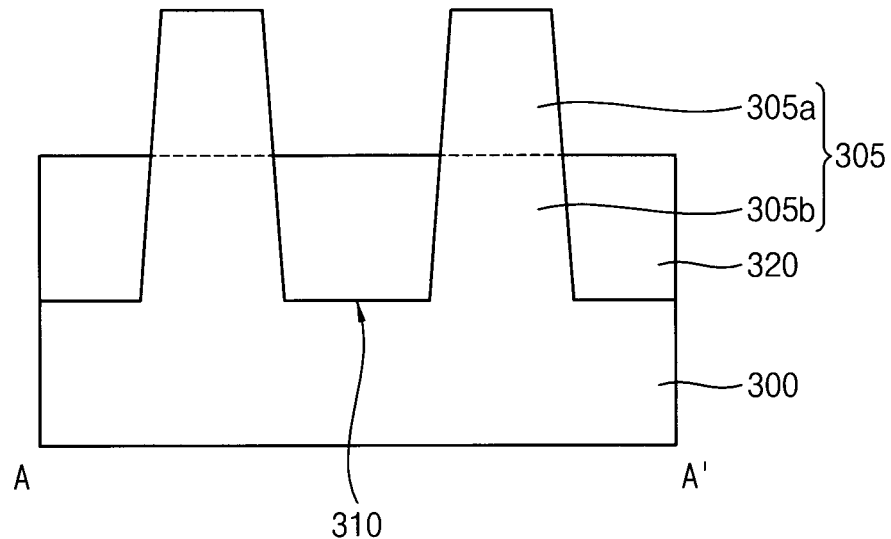
Figure 6:
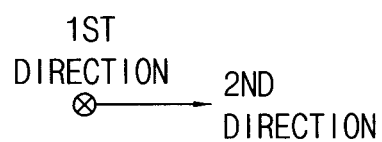
Figure 7:
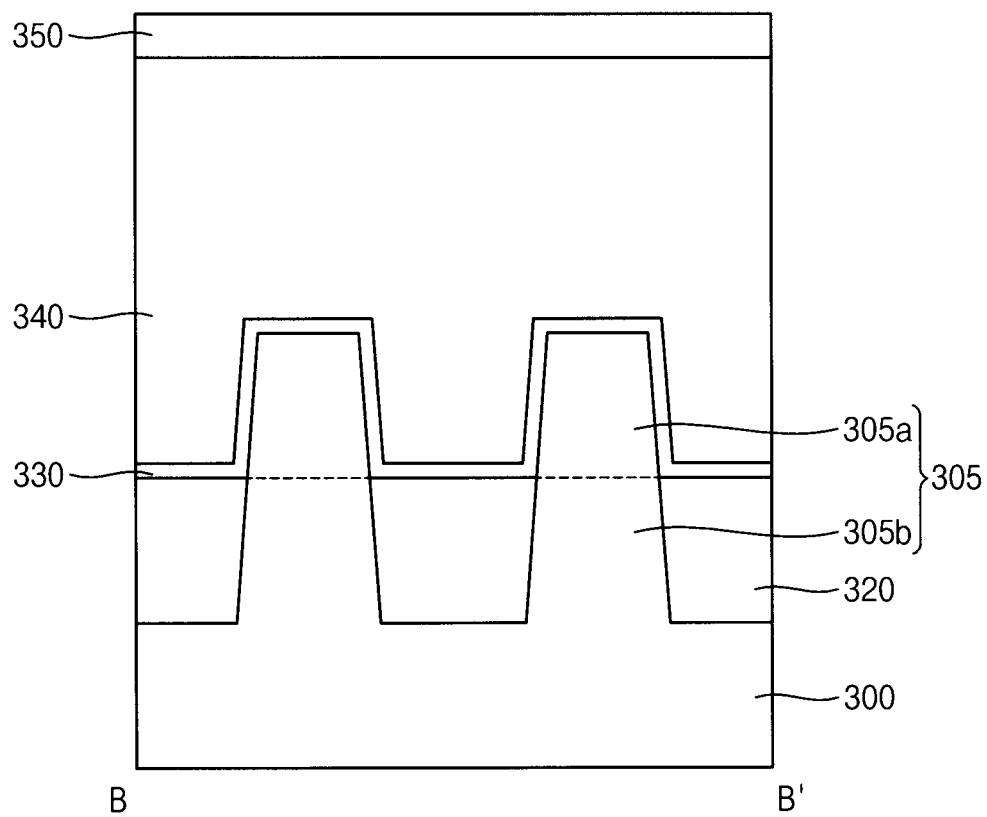
Figure 8:
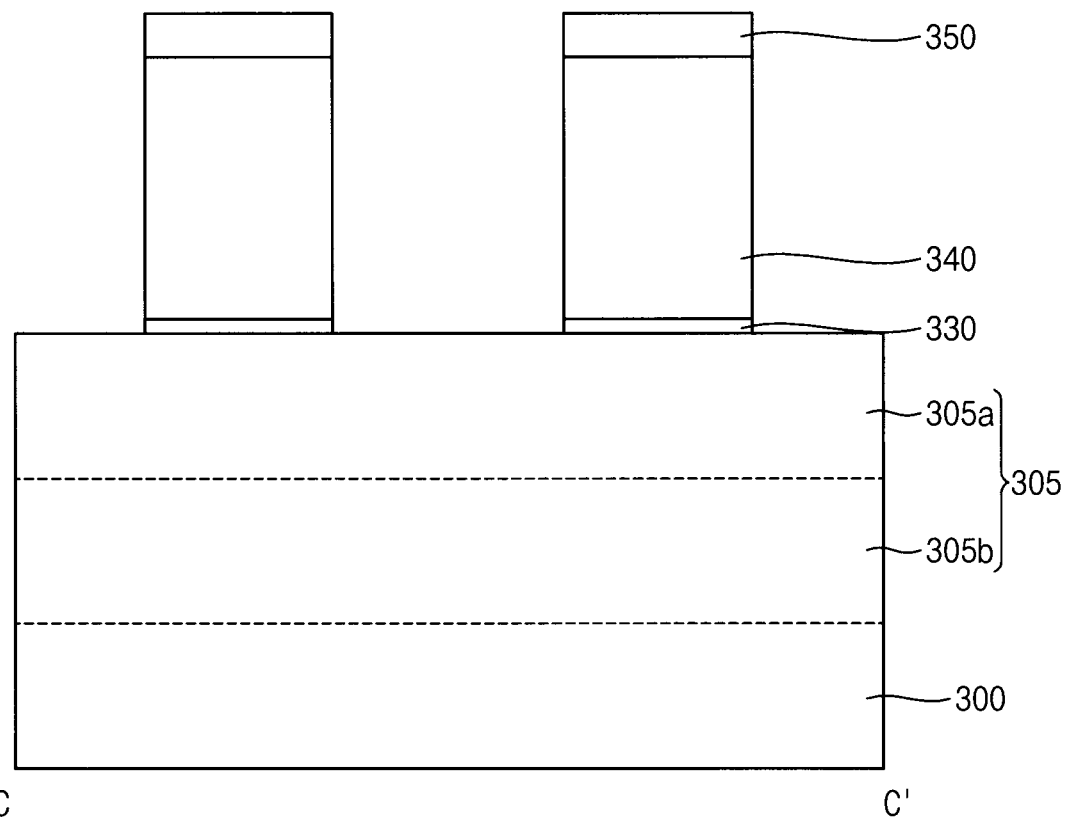

FIGS. 5 to 24 are planar views and cross-sectional views illustrating stages in a method of manufacturing a semiconductor device according to example embodiments. FIGS. 5, 9, 12, and 15 are planar views. FIGS. 6, 7, 8, 10, 11, 13, 14, and 16 to 24 are cross-sectional views. FIGS. 6, 10, and 13 are cross-sectional views taken along line A-A' of corresponding ones of FIGS. 5, 9, and 12. FIGS. 7 and 16 are cross-sectional views taken along line B-B' of corresponding ones of FIGS. 5 and 15. FIGS. 8, 11, 14, and 17 to 24 are cross-sectional views taken along line C-C' of corresponding ones of FIGS. 5, 9, 12, and 15.

Referring to FIGS. 5 to 8, an upper portion of the substrate 300 may be partly etched to form a first recess 310. After the device isolation pattern 320 is formed to fill a lower portion of the first recess 310, a dummy gate structure may be formed on the substrate 300 and the device isolation pattern 320.

As the first recess 310 is formed in the substrate 300, the active region 305 may be defined. In this case, the active region 305 may refer to the active fin 305 because the active region 305 has a fin shape protruding from the substrate 300.

In some embodiments, the active fin 305 may extend in the first direction. A plurality of active fins 305 may be formed to be arranged in the second direction.

In some embodiments, the device isolation pattern 320 may be formed by forming a device isolation layer on the substrate 300 to fill the first recess 310, planarizing the device isolation layer until an upper surface of the substrate 300 is exposed, and then removing an upper portion of the device isolation layer to expose an upper portion of the first recess 310.

In some embodiments, the active fin 305 may include the lower active pattern 305b, of which a sidewall is covered by the device isolation pattern 320, and an upper active pattern 305a protruding above an upper surface of the device isolation pattern 320.

The dummy gate structure may be formed by sequentially forming a dummy gate insulation layer, a dummy gate electrode layer, and a dummy mask layer on the active fin 305 and the device isolation pattern 320, patterning the dummy gate mask layer to form a dummy gate mask 350 on the substrate 300, and sequentially etching the dummy gate electrode layer and the dummy gate insulation layer using the dummy gate mask 350 as an etch mask. Thus, the dummy gate structure including a dummy gate insulation pattern 330, a dummy gate electrode 340, and the dummy gate mask 350 that are sequentially stacked on the substrate 300 may be formed.

The dummy gate insulation layer may include oxide, e.g., silicon oxide. The dummy gate electrode layer may include, e.g., polysilicon. The dummy gate mask layer may include nitride, e.g., silicon nitride.

The dummy gate insulation layer may be formed by a chemical vapor deposition process or an atomic layer deposition process. Alternatively, the dummy gate insulation layer may be formed by performing a thermal oxidation process on the upper portion of the substrate 300. In this case, the dummy gate insulation layer may be formed on only an upper surface of the active fin 305. The dummy gate electrode layer and the dummy gate mask layer may be also formed by a chemical vapor deposition process or an atomic layer deposition process.

In some embodiments, the dummy gate structure may extend in the second direction. A plurality of dummy gate structures may be formed to be arranged in the first direction.

Figure 9:
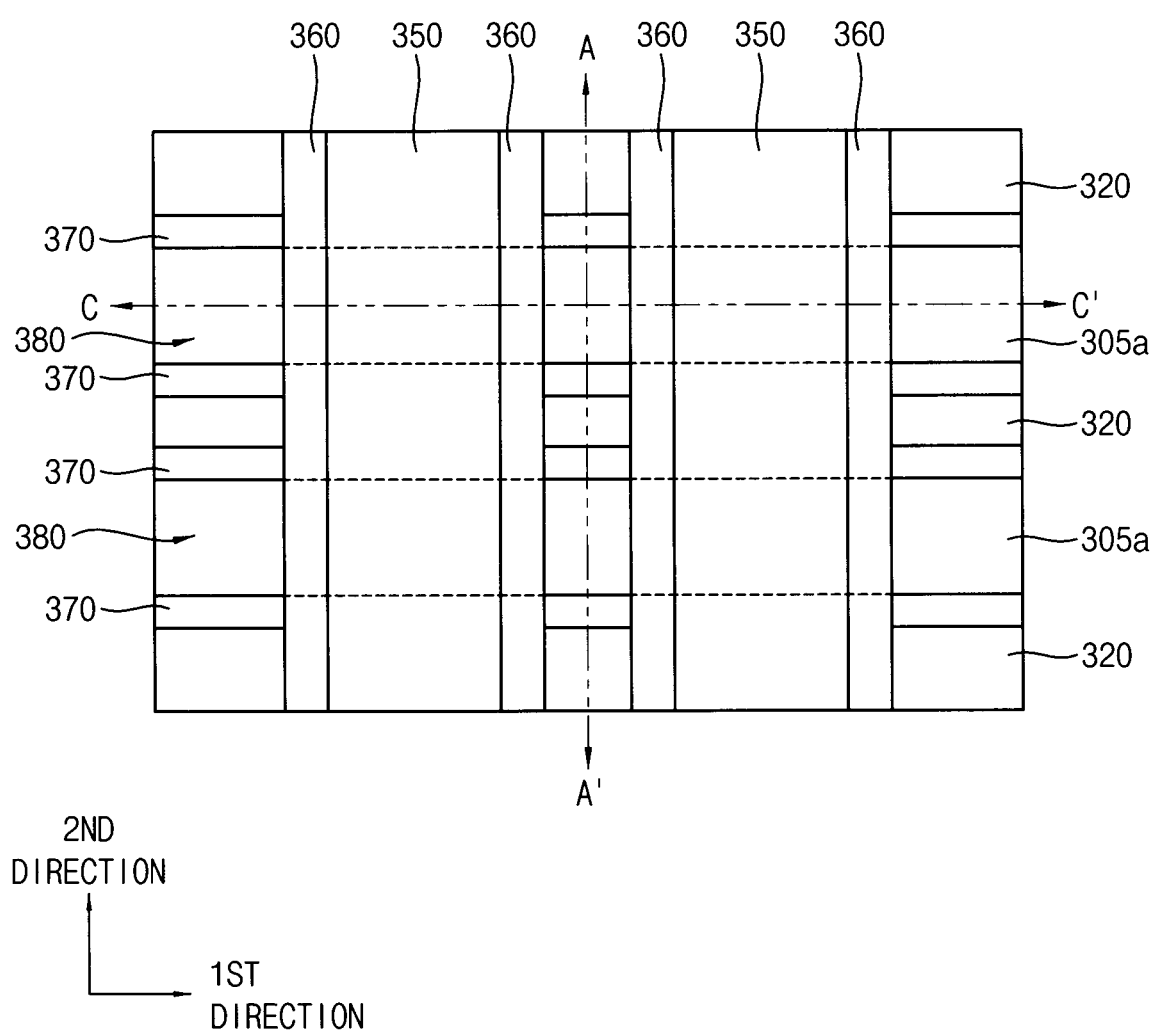
Figure 10:
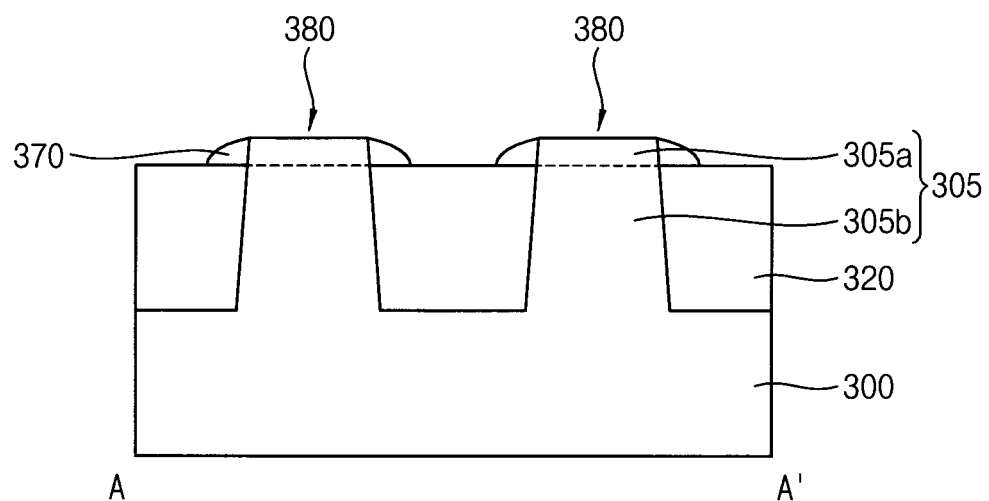
Figure 10:
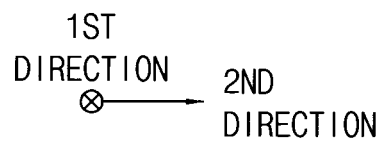
Figure 11:
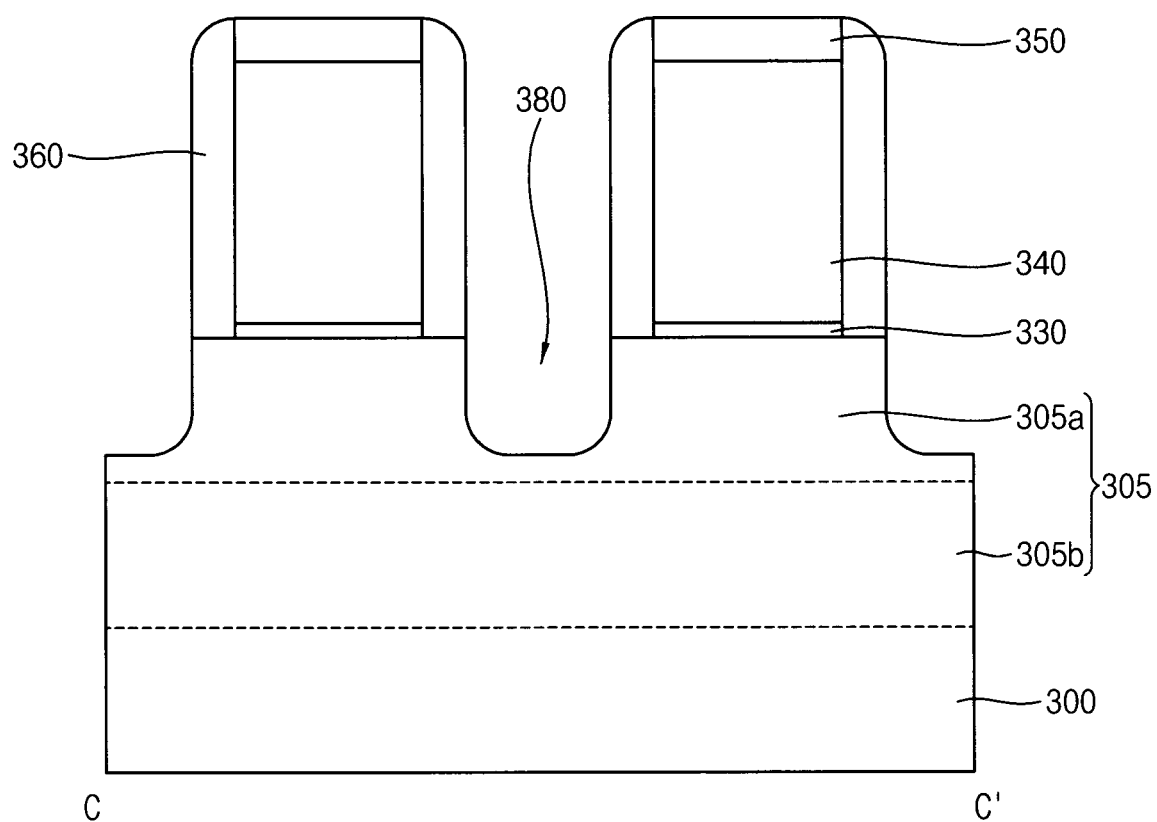
Figure 11:
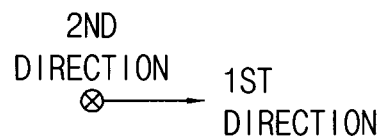

Referring to FIGS. 9 to 11, after a spacer layer is formed on the active fin 305 and the device isolation pattern 320 to cover the dummy gate structure, the spacer layer may be anisotropically etched to form the gate spacer 360 on each of opposite sidewalls of the dummy gate structure in the first direction and to form the fin spacer 370 on each of opposite sidewalls of the upper active pattern 305a in the second direction.

The spacer layer may include nitride, e.g., silicon nitride. In some embodiments, the spacer layer may include multiple stacked layers, each of which includes nitride and/or oxide.

An upper portion of the active fin 305 adjacent to the gate spacer 360 may be etched to form a second recess 380.

In the drawings, it is illustrated that a bottom surface of the second recess 380 is higher than an upper surface of the lower active pattern 305b because the second recess 380 is formed by etching only a portion of the upper active pattern 305a of the active fin 305. However, the inventive concepts are not limited thereto. For example, the second recess 380 may be formed by etching a portion of the lower active pattern 305b as well as the upper active pattern 305a, such that a height of the bottom surface of the second recess 380 may be lower than a height of a portion of the lower active pattern 305b in which the second recess 380 is not formed.

When the second recess 380 is formed, the fin spacer 370 of each of the opposite sidewalls of the upper active pattern 305a in the second direction may be partly or completely removed.

In some embodiments, the etch process for forming the second recess 380 may be performed in-situ with the etch process for forming the gate spacer 360 and the fin spacer 370.

Figure 12:
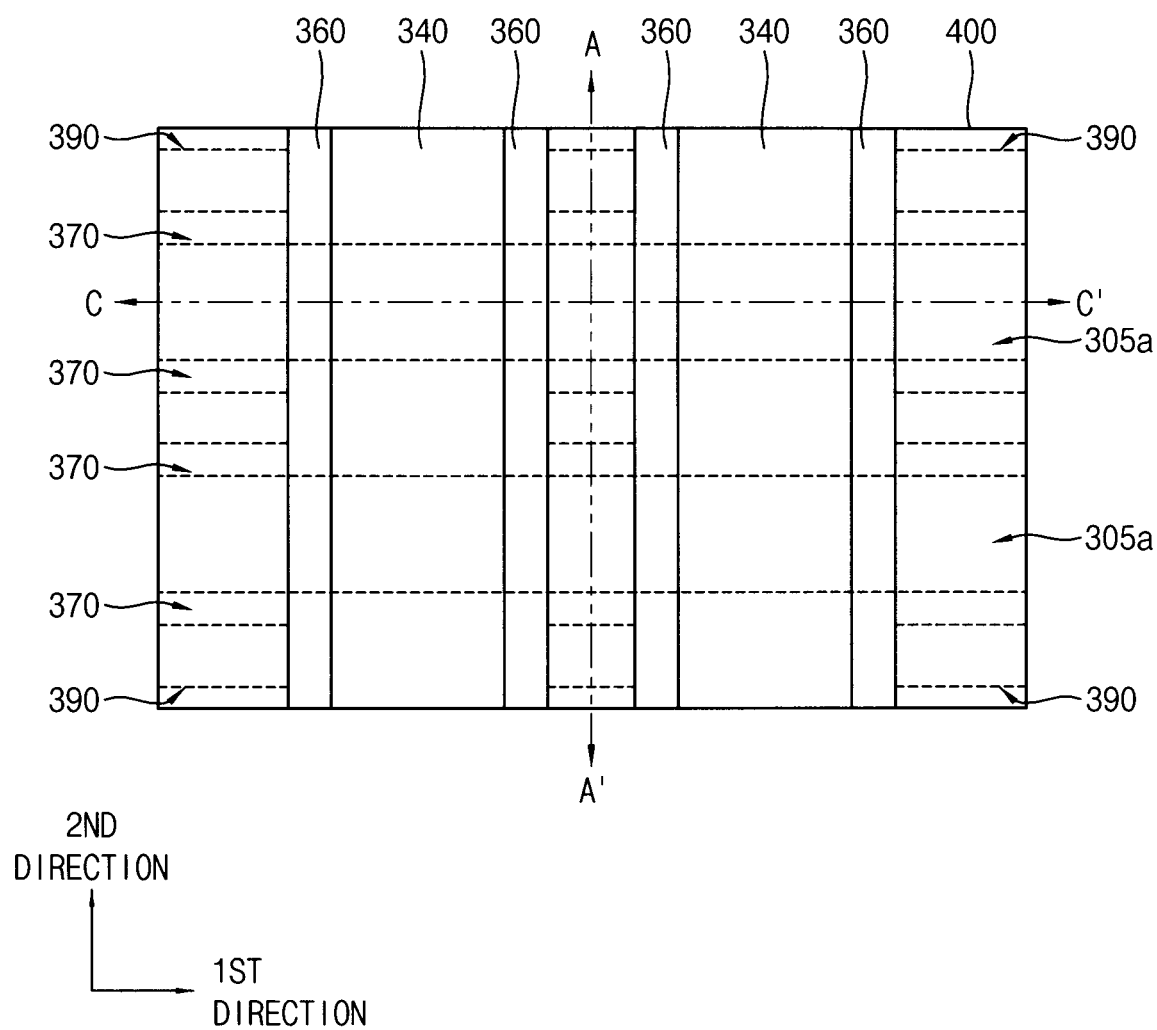
Figure 13:
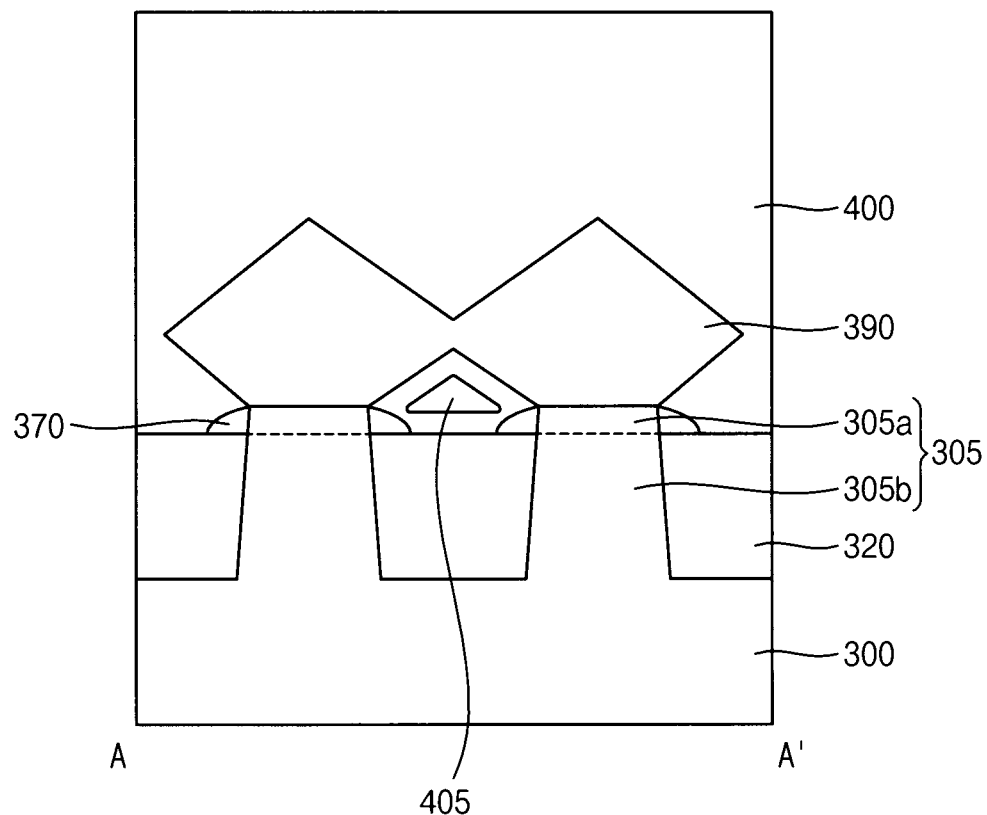
Figure 14:
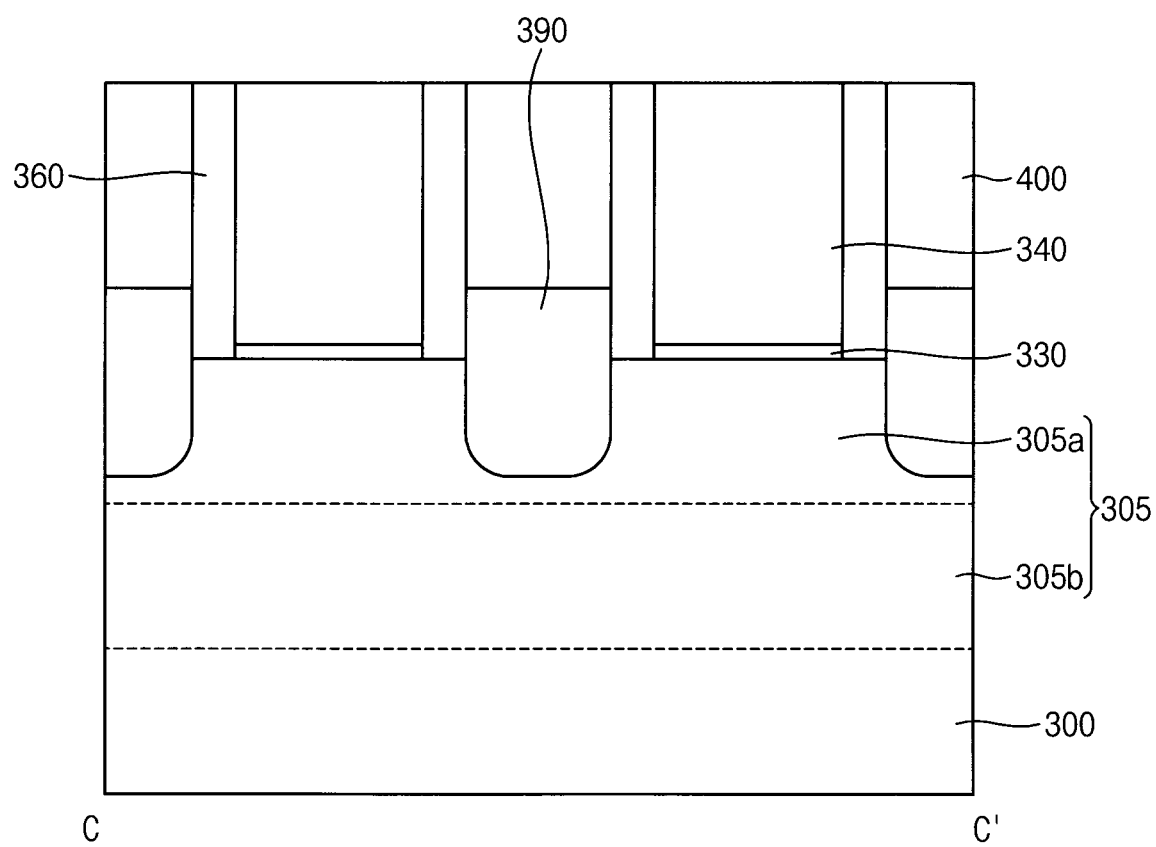

Referring to FIGS. 12 to 14, the source/drain layer 390 may be formed to fill the second recess 380.

In some embodiments, the source/drain layer 390 may be formed by performing a selective epitaxial growth (SEG) process using a surface of the active fin 305 exposed by the second recess 380 as a seed.

In some embodiments, the selective epitaxial growth process may be performed using a silicon source gas, a germanium source gas, an etch gas, and a carrier gas. Thus, a monocrystalline silicon-germanium layer may be formed as the source/drain layer 390. The selective epitaxial growth process may also use a p-type impurity source gas together such that a p-type impurity doped monocrystalline silicon-germanium layer may be formed as the source/drain layer 390.

In some embodiments, the selective epitaxial growth process may be performed using a silicon source gas, a carbon source gas, an etch gas, and a carrier gas. Thus, a monocrystalline silicon carbide layer may be formed as the source/drain layer 390. The selective epitaxial growth process may also use an n-type impurity source gas together such that an n-type impurity doped monocrystalline silicon carbide layer may be formed as the source/drain layer 390. Alternatively, the selective epitaxial growth process may be performed using a silicon source gas, an etch gas, and a carrier gas. Thus, a monocrystalline silicon layer may be formed as the source/drain layer 390. In this case, the selective epitaxial growth process may use an n-type impurity source gas together, such that an n-type impurity doped monocrystalline silicon layer may be formed as the source/drain layer 390.

The source/drain layer 390 may be grown in a vertical direction and a horizontal direction to fill the second recess 380, such that an upper portion of the source/drain layer 390 may contact the sidewall of the gate spacer 360. In some embodiments, the source/drain layer 390 may have a cross section taken along the second direction, which has a shape similar to a pentagonal shape.

In some embodiments, when a distance between the active fins 305 adjacent to each other in the second direction is small, the source/drain layers 390 grown from respective ones of the active fins 305 may be connected to each other to be merged with each other. In the drawings, it is illustrated that two source/drain layers 390 grown from respective ones of two active fins 305 adjacent to each other in the second direction are merged with each other. However, the inventive concepts are not limited thereto. For example, any plurality of source/drain layers 390 may be merged with each other.

The first interlayer insulation layer 400 may be formed on the active fin 305 and the device isolation pattern 320 with a sufficient thickness to cover the dummy gate structure, the gate spacer 360, the fin spacer 370, and the source/drain layer 390, and then may be planarized until an upper surface of the dummy gate electrode 340 is exposed. During the planarization of the first interlayer insulation layer 400, the dummy gate mask 350 may be removed together.

The first interlayer insulation layer 400 may not completely fill a space between the merged source/drain layers 390 and the device isolation pattern 320 such that the air-gap 405 may be formed.

The first interlayer insulation layer 400 may include silicon oxide, e.g., TOSZ. The planarization process may be performed by a chemical mechanical polishing (CMP) process and/or an etch back process.

Figure 15:
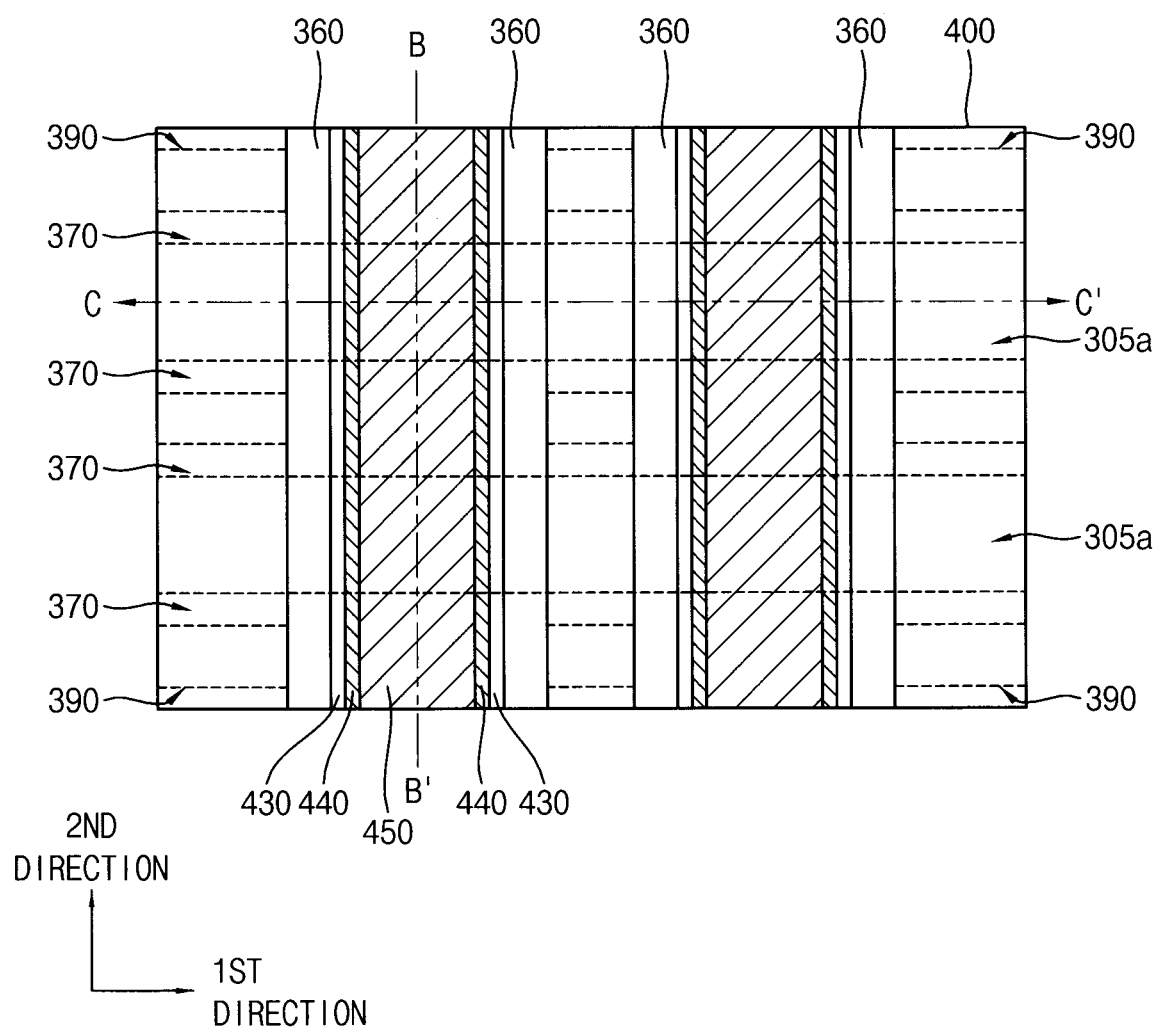
Figure 16:
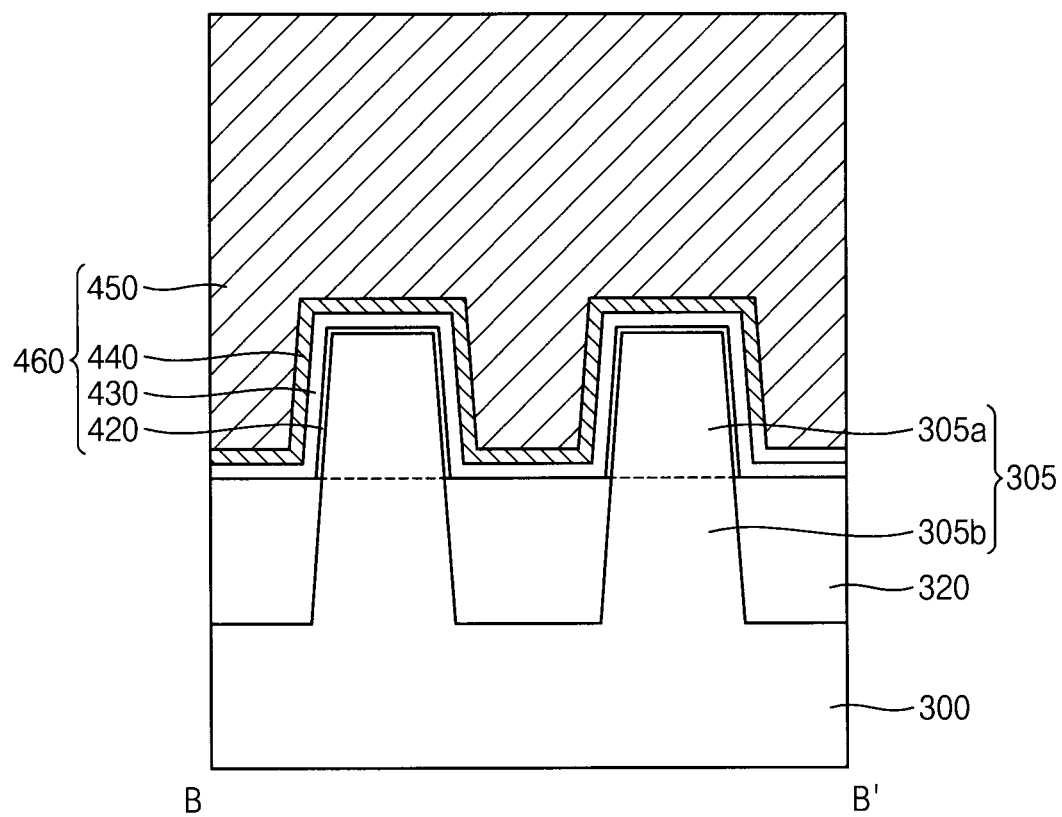
Figure 17:
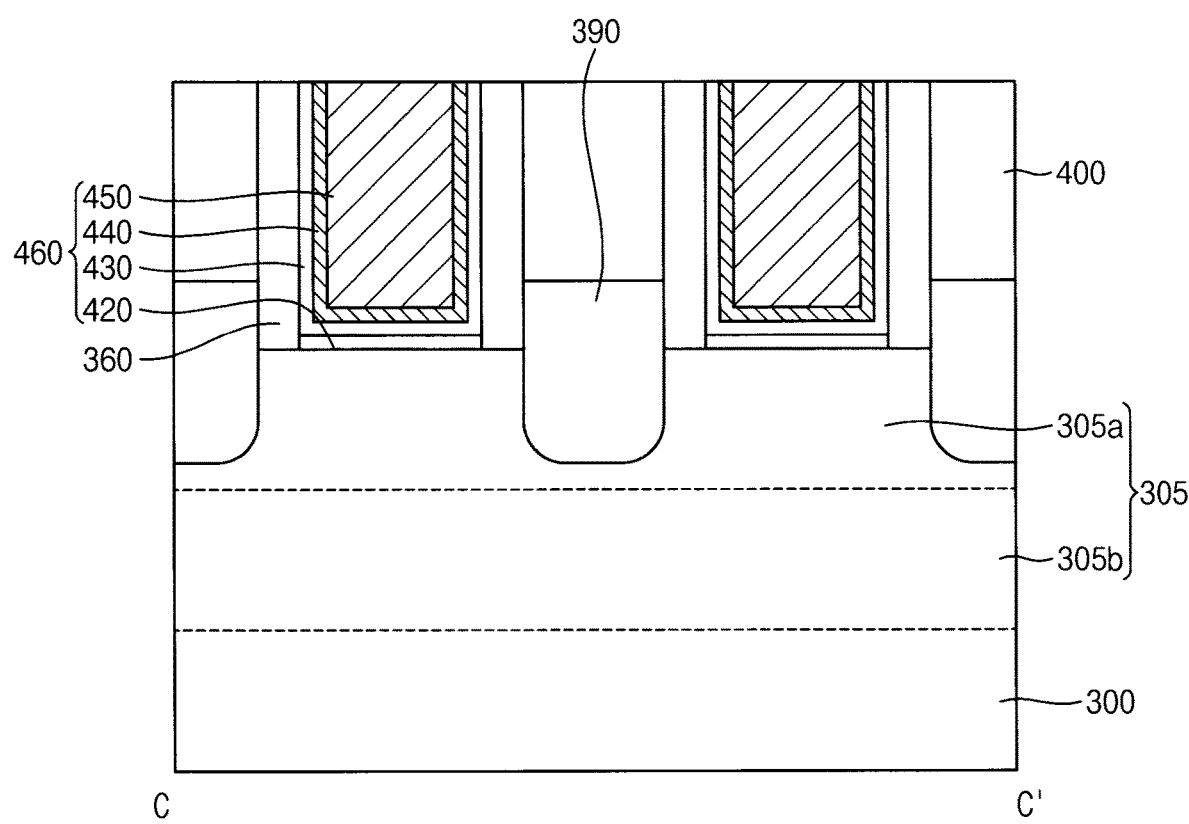

Referring to FIGS. 15 to 17, the exposed dummy gate electrode 340 and the underlying dummy gate insulation pattern 330 may be removed to form a first opening exposing an inner surface of the gate spacer 360 and an upper surface of the active fin 305, and then the gate electrode structure 460 may be formed to fill the first opening.

Specifically, after a thermal oxidation process is performed on the upper surface of the active fin 305 exposed by the first opening to form the interface pattern 420, a gate insulation layer and a work function control layer may be sequentially formed on the interface pattern 420, the device isolation pattern 320, the gate spacer 360, and the first interlayer insulation layer 400, and then a gate electrode layer may be formed on the work function control layer to fill a remaining portion of the first opening.

The work function control layer and the gate electrode layer may be formed by a chemical vapor deposition process, an atomic layer deposition process, and/or a physical vapor deposition process. Thereafter, an annealing process, e.g., a rapid thermal annealing (RTA) process, a spike RTA process, a flash RTA process, or a laser annealing process, may be performed on the gate electrode layer.

In some embodiments, the interface pattern 420 may be formed by a chemical vapor deposition process or an atomic layer deposition process. In this case, the interface pattern 420 may be formed on the upper surface of the device isolation pattern 320 and the inner surface of the gate spacer 360 as well as the upper surface of the active fin 305.

The gate electrode layer, the work function control layer, and the gate insulation layer may be planarized until an upper surface of the first interlayer insulation layer 400 is exposed, such that the gate insulation pattern 430 and the work function control pattern 440 may be sequentially formed on an upper surface of the interface pattern 420, the upper surface of the device isolation pattern 320 and the inner surface of the gate spacer 360 and the gate electrode 450 may be formed on the work function control pattern 440 to fill the remaining portion of the first opening.

The interface pattern 420, the gate insulation pattern 430, the work function control pattern 440, and the gate electrode 450 that are sequentially stacked may form the gate electrode structure 460 and may form a transistor with the source/drain layer 390. The transistor may be a PMOS transistor or an NMOS transistor depending on a conductivity type of the source/drain layer 390.

Figure 18:
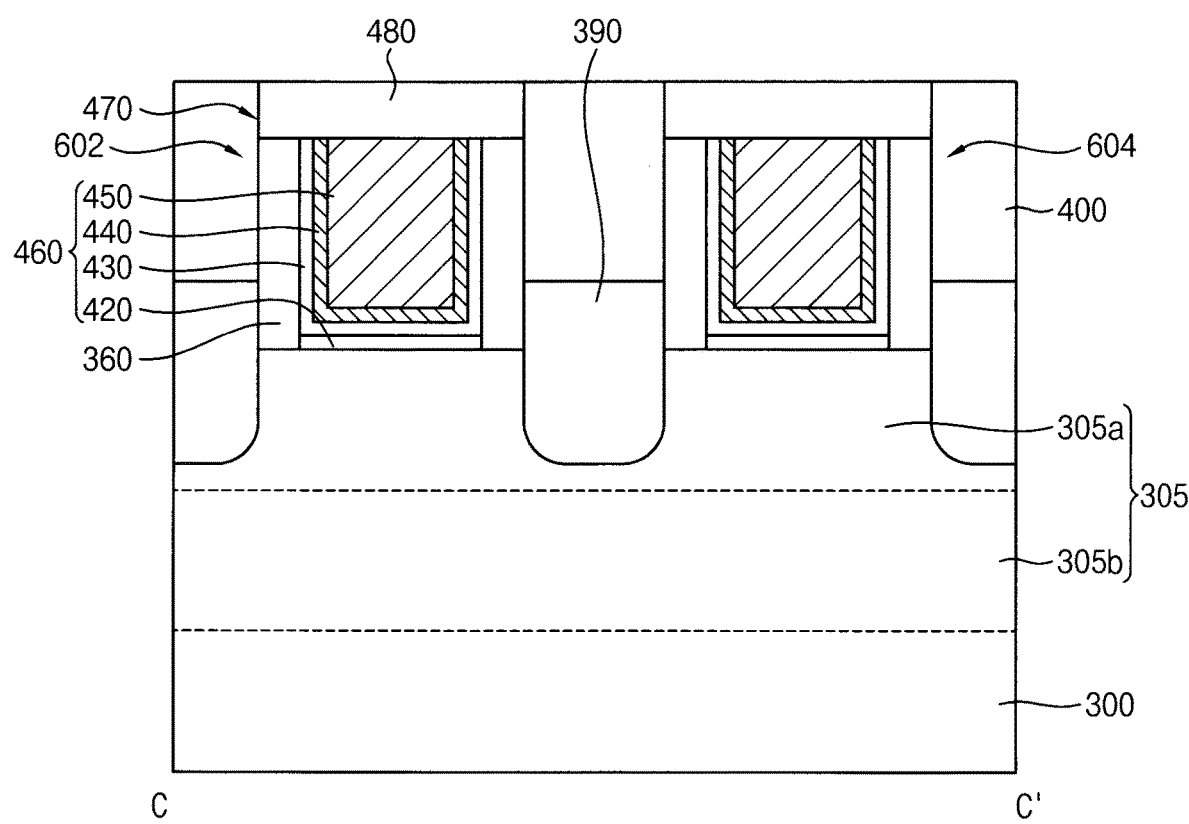
Figure 18:
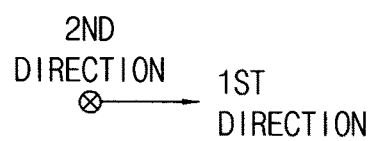

Referring to FIG. 18, the upper portions of the gate electrode structure 460 and the gate spacer 360 may be removed to form a third recess 470, and then the first capping pattern 480 may be formed to fill the third recess 470.

The first capping pattern 480 may be formed by forming a capping layer on the gate electrode structure 460, the gate spacer 360, and the first interlayer insulation layer 400 and then planarizing the capping layer until the upper surface of the first interlayer insulation layer 400 is exposed.

In some embodiments, the first capping pattern 480 may include nitride, e.g., silicon nitride.

Hereinafter, a structure including the gate electrode structure 460, the gate spacer 360 covering or on a sidewall of the gate electrode structure 460, and the first capping pattern 480 covering or on the upper surfaces of the gate electrode structure 460 and/or the gate spacer 360 refer to the gate structure. In FIG. 18, the first and second gate structures 602 and 604 are illustrated.

Figure 19:
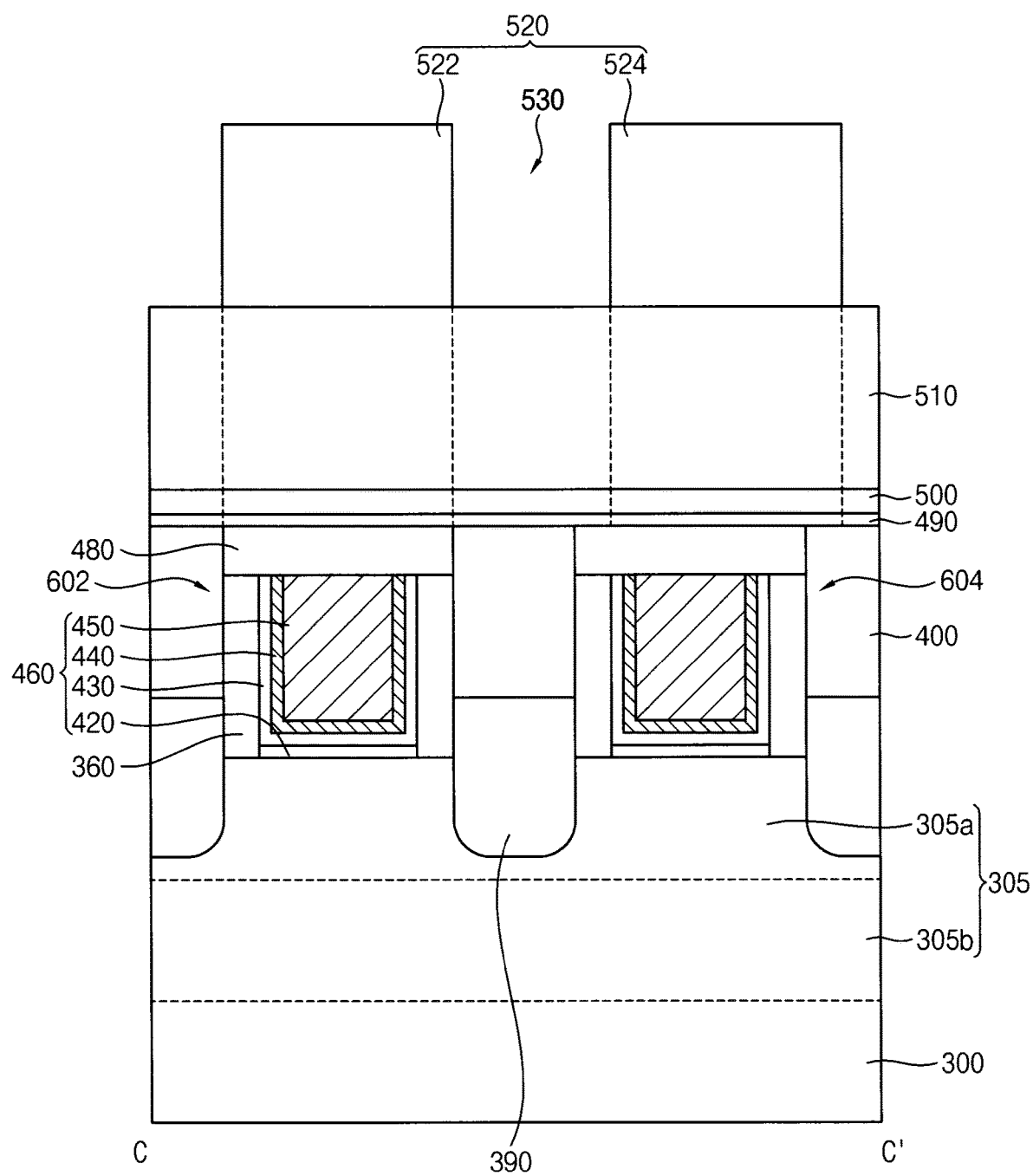

Referring to FIG. 19, the first etch stop layer 490, the second etch stop layer 500, and the second interlayer insulation layer 510, and the etch mask structure 520 may be sequentially formed on the first interlayer insulation layer 400 and the first capping pattern 480.

The etch mask structure 520 may be formed by forming an etch mask layer on the second interlayer insulation layer 510 and then patterning the etch mask layer through an etch process using a photoresist pattern. The etch mask structure 520 may include, e.g., silicon on hardmask (SOH) or an amorphous carbon layer (ACL).

The etch mask structure 520 may include a plurality of etch masks spaced apart from each other in the first direction by a second opening 530. In FIG. 19, a first etch mask 522 and a second etch mask 524 corresponding to the first gate structure 602 and the second gate structure 604, respectively, are illustrated.

In some embodiments, the second interlayer insulation layer 510 may include oxide, e.g., silicon oxide. The second etch stop layer 500 may include a material having an etch selectivity with respect to the second interlayer insulation layer 510, e.g., nitride, such as silicon nitride. The first etch stop layer 490 may include a material having an etch selectivity with respect to the second etch stop layer 500, e.g., oxide, such as silicon oxide.

In some embodiments, some etch masks of the etch mask structure 520 may be formed to be vertically overlapped with corresponding ones of the gate structures, but a misalignment may partially occur in the process of forming the etch mask structure 520. Thus, as shown in FIG. 19, the first etch mask 522 may be aligned with the first gate structure 602 in a vertical direction, but the second etch mask 524 may not be accurately aligned with the second gate structure 604 in the vertical direction and may be offset by a predetermined distance in the second direction.

Figure 20:
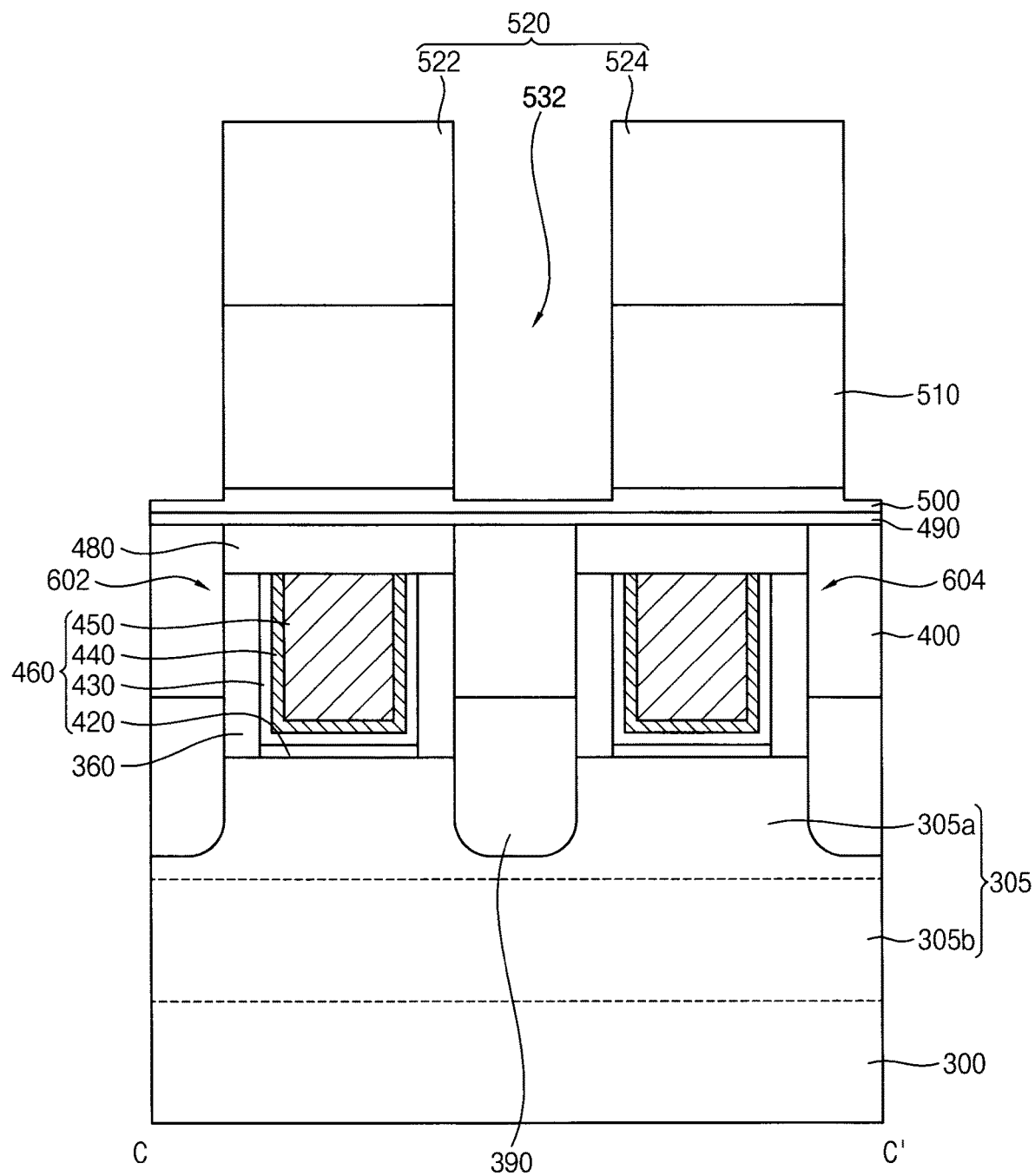

Referring to FIG. 20, an etch process may be performed using the etch mask structure 520 as an etch mask to etch the second interlayer insulation layer 510. The etch process may use the second etch stop layer 500 as an etch end point.

Accordingly, the second opening 530 may be enlarged downward such that a third opening 532 may be formed to expose the second etch stop layer 500. An upper portion of the second etch stop layer 500 may be partially removed in the above etch process.

Figure 21:
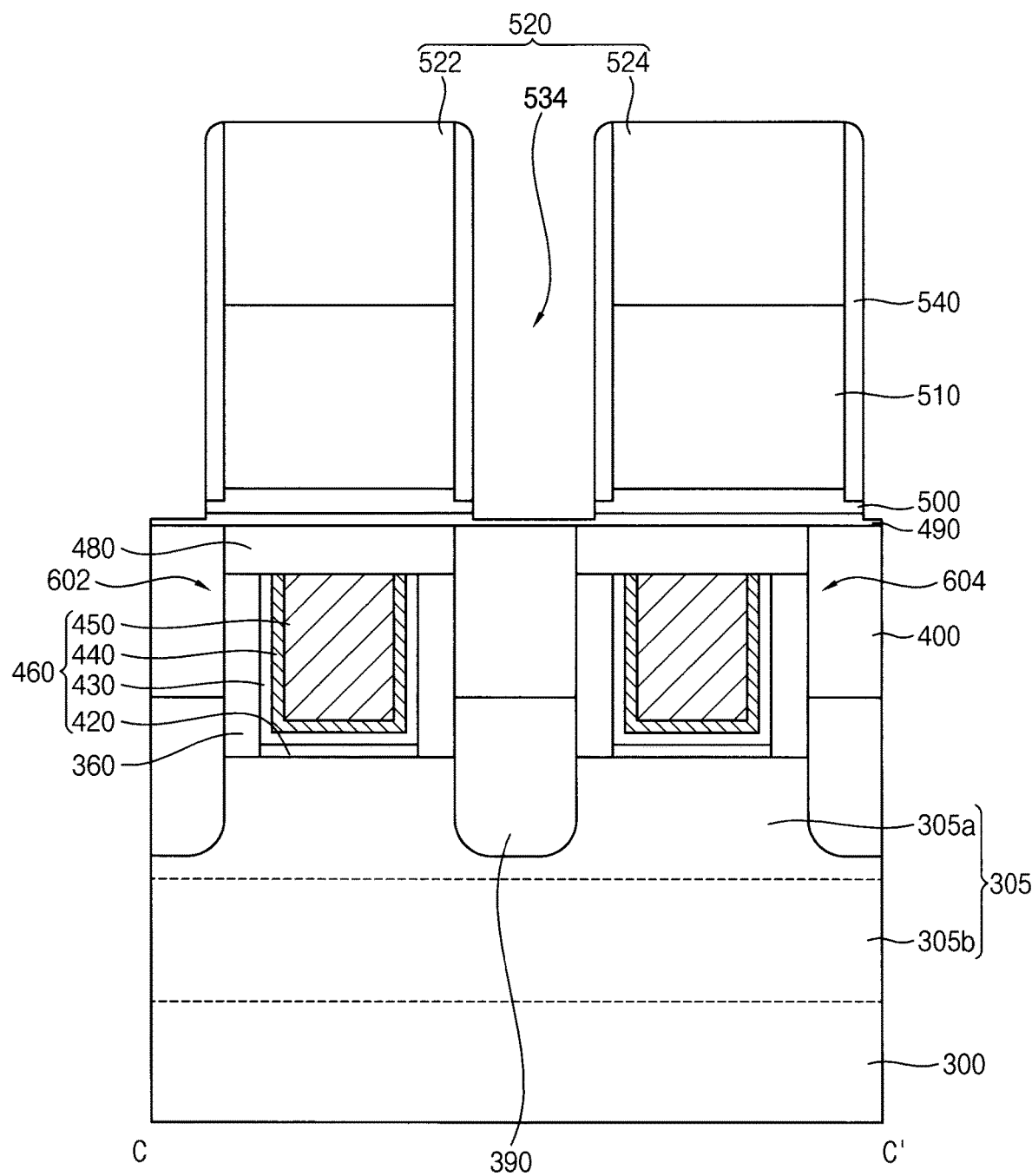

Referring to FIG. 21, a sacrificial spacer 540 may be formed on a sidewall of the third opening 532, and then an etch process may be performed using the etch mask structure 520, the second interlayer insulation layer 510, and the sacrificial spacer 540 as en etch mask to etch the second etch stop layer 500. The etch process may use the first etch stop layer 490 as an etch end point.

Accordingly, a portion of the third opening 532 defined by the sacrificial spacer 540 may be enlarged downward, such that a fourth opening 534 may be formed to expose the first etch stop layer 490. An upper portion of the first etch stop layer 490 may be partially removed in the above etch process.

The sacrificial spacer 540 may be formed by forming a sacrificial spacer layer on an upper surface of the second etch stop layer 500 exposed by the third opening 532, the sidewall of the third opening 532, and an upper surface of the etch mask structure 520 and anisotropically etching the sacrificial spacer layer. Thus, the sacrificial spacer 540 may be formed on each of opposite inner sidewalls of the third opening 532. The sacrificial spacer 540 may include oxide, e.g., silicon oxide.

Since the sacrificial spacer 540 may be formed on each of the opposite inner sidewalls of the third opening 532 with an appropriate thickness, even though sidewalls of some etch masks are not aligned with sidewalls of the corresponding gate structures thereunder, the gate structures may not be etched in the following etch process.

In some embodiments, an outer sidewall of the sacrificial spacer 540 on a first sidewall of the second etch mask 524 may be formed to be vertically overlapped with or be adjacent to an outer sidewall of the gate spacer 360 of the second gate structure 604.

In FIG. 21, it is illustrated that the outer sidewall of the sacrificial spacer 540 may be further offset to an inner sidewall of the gate spacer 360 of the second gate structure 604 than to the outer sidewall of the gate spacer 360 of the second gate structure 604. However, the inventive concepts are not limited thereto. For example, the outer sidewall of the sacrificial spacer 540 may be offset to the outside of the second gate structure 604, e.g., to the first interlayer insulation layer 400 covering a sidewall of the second gate structure 604.

The sacrificial spacer 540 on a second sidewall of the second etch mask 524 opposite to the first sidewall thereof may be formed on the first interlayer insulation layer 400 covering the sidewall of the second gate structure 604.

The sacrificial spacers 540 on opposite first and second sidewalls of the first etch mask 522 may be formed on the first interlayer insulation layer 400 covering sidewalls of the first gate structure 602.

Figure 22:
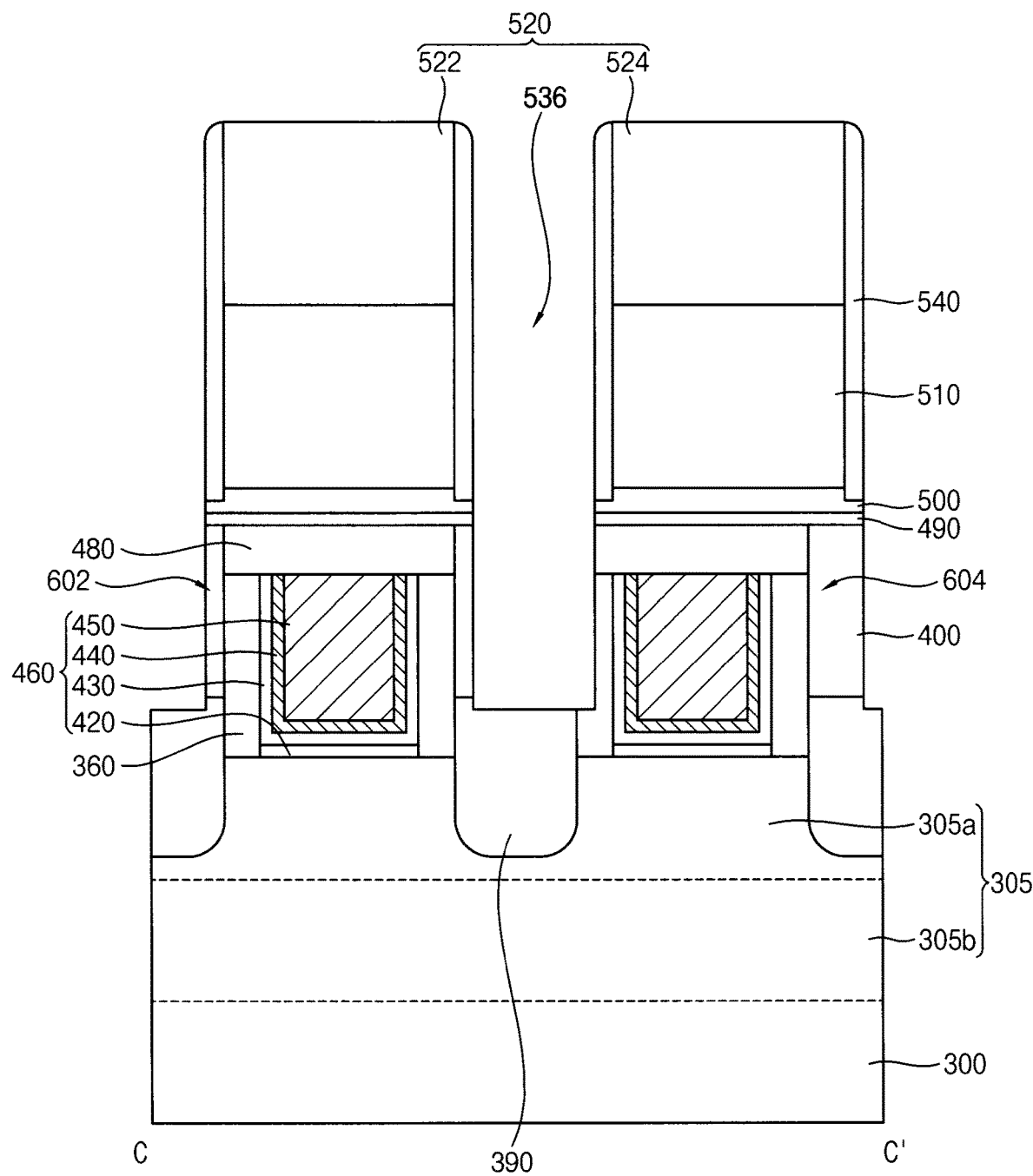

Referring to FIG. 22, an etch process may be performed using the etch mask structure 520, the second interlayer insulation layer 510, and the sacrificial spacer 540 as an etch mask to etch the first etch stop layer 490 and the first interlayer insulation layer 400. The etch process may use the source/drain layer 390 as an etch end point.

Thus, the fourth opening 534 may be enlarged downward, such that a fifth opening 536 exposing the source/drain layer 390 may be formed. An upper portion of the source/drain layer 390 may be partially removed in the above etch process.

As described above, as the sacrificial spacer 540 is formed on each of the sidewalls of the third opening 532, even though the etch process is performed, the gate electrode structure 460 of each of the gate structures may not be etched. In FIG. 22, it is illustrated that an edge portion of the first capping pattern 480 and an edge portion of the gate spacer 360 that are respectively on the upper surface and the sidewall of the gate electrode structure 460 of the second gate structure 604 are partially etched. However, the gate electrode structure 460 may not be exposed by the above etch process.

Since the gate electrode structure 460 is not etched by protection of the sacrificial spacer 540, an etch gas having a high etch selectivity between the first interlayer insulation layer 400 and the first capping pattern 480 or between the first interlayer insulation layer 400 and the gate spacer 360 may not be used, such that the fifth opening 536 may be formed to have a sidewall vertical to the upper surface of the substrate 300. The fifth opening 536 may have a width that is not tapered downward (e.g., have a constant width regardless of a height or a depth thereof).

A portion of the first interlayer insulation layer 400 covering the sidewall of the second gate structure 604 below the second sidewall of the second etch mask 524 and another portion of the first interlayer insulation layer 400 covering the sidewalls of the first gate structure 602 below the sidewalls of the first etch mask 522 may be left unetched.

Figure 23:
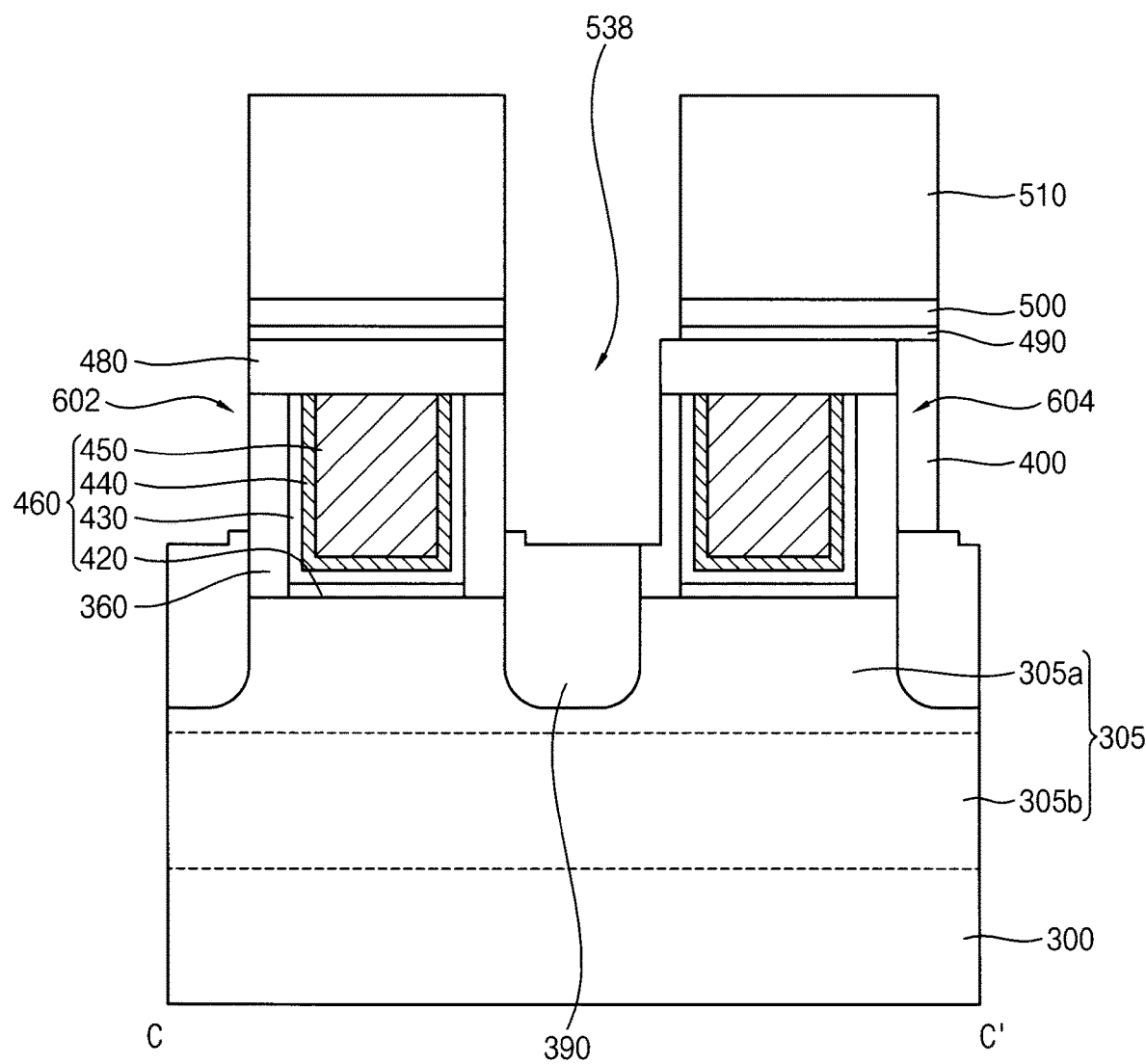

Referring to FIG. 23, the sacrificial spacer 540 may be removed. At this time, portions of the first and second etch stop layers 490 and 500 and a portion of the first interlayer insulation layer 400 that are under the sacrificial spacer 540 may be also removed.

Thus, the width of the fifth opening 536 may be enlarged such that a sixth opening 538 may be formed. In some embodiments, the sacrificial spacer 540, and the portions of the first and second etch stop layers 490 and 500 and the first interlayer insulation layer 400 thereunder may be removed by a wet etch.

As the sixth opening 538 is formed, the sidewalls of the gate structures may be exposed. The sixth opening 538 may be formed to be self-aligned with the sidewalls of the gate structures. In FIG. 23, it is illustrated that all the sidewalls of the first gate structure 602 are exposed and one sidewall of the second gate structure 604 formed by the misalignment is exposed.

In some embodiments, since the sacrificial spacer 540, the first etch stop layer 490, and the first interlayer insulation layer 400 includes oxide, e.g., silicon oxide and the second etch stop layer 500 has been partially removed during the formation of the third opening 532, the sacrificial spacer 540, the first etch stop layer 490, the first interlayer insulation layer 400, and the second etch stop layer 500 may be removed together in the above etch process. However, since the first capping pattern 480 and the gate spacer 360 includes nitride, e.g., silicon nitride, the first capping pattern 480 and the gate spacer 360 may not be removed in the above etch process. Accordingly, even though the etch process is performed, the gate electrode structures 460 of the first and second gate structures 602 and 604 may be not exposed by the first capping pattern 480 and the gate spacer 360.

The sixth opening 538 formed between the first gate structure 602 and the second gate structure 604 may include an upper portion equal to or above a height level of the upper surfaces of the first and second gate structures 602 and 604 and a lower portion below the height level thereof. A width of the upper portion of the sixth opening 538 may be greater than a width of the lower portion thereof. A lower surface or lower sidewall of the upper portion of the sixth opening 538 may expose a portion of an upper surface (e.g., an edge upper surface) or upper sidewall of the first capping pattern 480 of the second gate structure 604.

By a portion of the first interlayer insulation layer 400 remaining below the sacrificial spacer 540 on each of the sidewalls of the first etch mask 522 during the formation of the fifth opening 536, a lower surface of the sixth opening 538 formed between the first gate structure 602 and the second gate structure 604 may include a portion adjacent to the first gate structure 602, that is relatively higher with respect to the upper surface of the substrate 300. Thus, the lower surface of the sixth opening 538 may have a stepped shape.

After the sixth opening 538 is formed, the etch mask structure 520 may be removed, e.g., an ashing and/or strip process.

Figure 24:
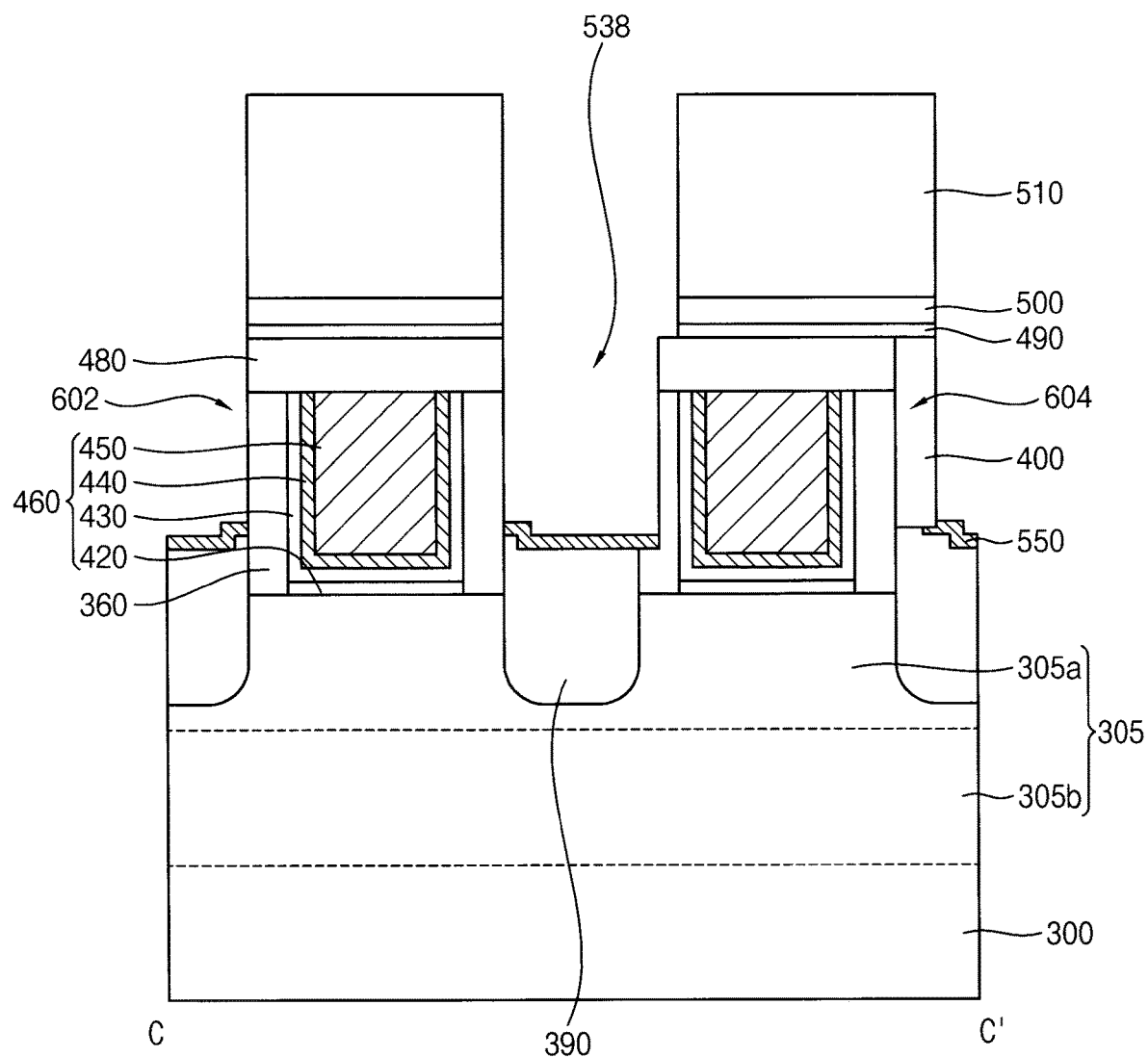

Referring to FIG. 24, a first metal layer may be formed on the upper surface of the source/drain layer 390, an inner sidewall of the sixth opening 538, and an upper surface of the second interlayer insulation layer 510, and then an annealing process may be performed to form a metal silicide pattern 550 on the upper surface of the source/drain layer 390.

As the lower surface of the sixth opening 538 formed between the first and second gate structures 602 and 604 (or formed at a side of the second gate structure 604) has the stepped shape, the metal silicide pattern 550 on the lower surface of the sixth opening 538 may have an upper surface having a stepped shape.

Even though the sixth opening 538 formed at another side of the second gate structure 604 does not expose an edge portion of the source/drain layer 390, the metal silicide pattern 550 may be formed between the source/drain layer 390 and the first interlayer insulation layer 400 adjacent to the sixth opening 538 because the metal silicide pattern 550 is isotropically formed by the annealing process.

Referring again to FIGS. 1 to 4, a barrier layer may be formed on the upper surface of the metal silicide pattern 550, the sidewall of the sixth opening 538, and the upper surface of the second interlayer insulation layer 510. A second metal layer may be formed on the barrier layer to fill the sixth opening 538. The second metal layer and the barrier layer may be planarized until the upper surface of the second interlayer insulation layer 510 is exposed.

Thus, the contact plug may be formed on the metal silicide pattern 550 to fill the sixth opening 538.

The contact plug may include the metal pattern 570 and the barrier pattern 560 covering the lower surface and the sidewall of the metal pattern 570. The contact plug may be formed between the gate structures spaced apart from each other in the first direction. Hereinafter, the contact plug that is adjacent to the first sidewall of the second gate structure 604 facing the first gate structure 602 refers to the first contact plug 582, and the contact plug that is adjacent to the second sidewall of the second gate structure 604 opposite to the first sidewall thereof refers to the second contact plug 584.

As described above, when some etch masks of the etch mask structure 520 for forming the first and second contact plugs 582 and 584 self-aligned with the gate structures is misaligned with the gate structure, the sacrificial spacer 540 may be formed on each of the sidewalls of the etch masks to increase the width of each of the etch masks. Thus, when the first interlayer insulation layer 400 is etched through the etch process using the etch masks, the gate electrode structure 460 of each of the gate structures may not be exposed or etched.

Therefore, the etch gas used in the etch process may not include a material having a high etch selectivity between the first interlayer insulation layer 400 and the first capping pattern 480 or the gate spacer 360, and thus the sixth opening 538 exposing the source/drain layer 390 through the etch process may be formed to have the vertical sidewall without being sloped with respect to the upper surface of the substrate 300. The portion of the first interlayer insulation layer 400 may be removed together with the sacrificial spacer 540, such that a lower width of the sixth opening 538 may not be reduced. Thus, a contact area between each of the first and second contact plugs 582 and 584 in the sixth opening 538 and the source/drain layer 390 may not be reduced, such that an increase in a contact resistance may be prevented.

Figure 25:
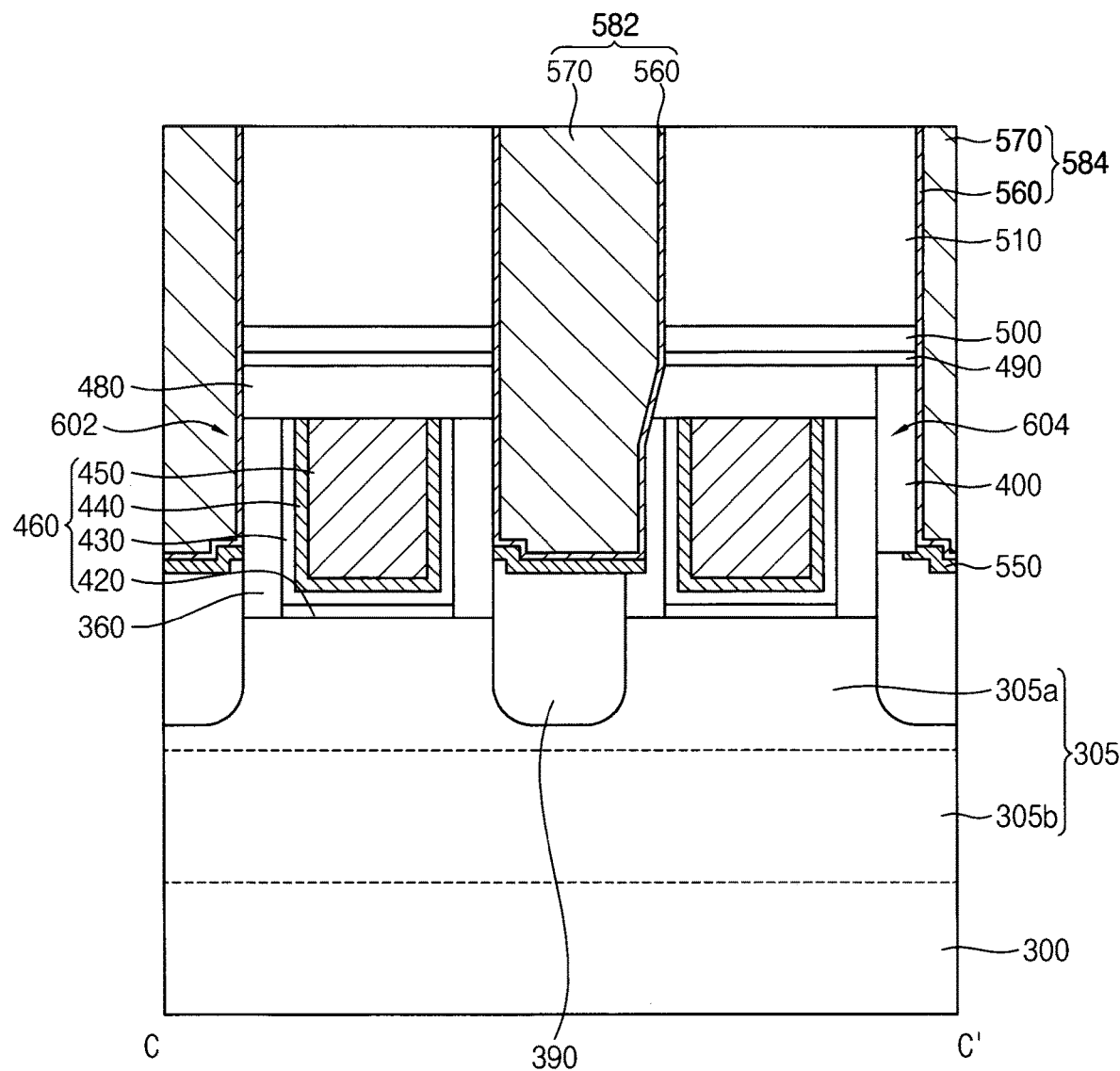
FIG. 25 is a cross-sectional view illustrating a semiconductor device according to some embodiments of the present inventive concept.

FIG. 25 is a cross-sectional view illustrating a semiconductor device according to example embodiments. FIG. 25 is a cross-sectional view taken along line C-C' of FIG. 1.

A semiconductor may be the same as or similar to the semiconductor device described with reference to FIGS. 1 to 4, except for a shape of the first contact plug 582. Thus, detailed descriptions thereof are omitted.

Referring to FIG. 25, in the semiconductor device, the first contact plug 582 between the first gate structure 602 and the second gate structure 604 may have the second sidewall contacting the sidewall of the second gate structure 604 and having a slope that changes depending on a height.

Specifically, the second sidewall of the first contact plug 582 may have a slope of less than 90° with respect to the upper surface of the substrate 300 in a predetermined range below the height level of the upper surface of the second gate structure 604, and may have a slope of 90° with respect to the upper surface of the substrate 300 below the predetermined range. In the predetermined range, the sidewall of the second gate structure 604, e.g., the sidewalls of the first capping pattern 480 and the gate spacer 360 may also have a slope corresponding to the second sidewall of the first contact plug 582. Nevertheless, since the first contact plug 582 is spaced a sufficient distance apart from the gate electrode structure 460 of the second gate structure 604, an electrical short therebetween may not occur.

Figure 26:
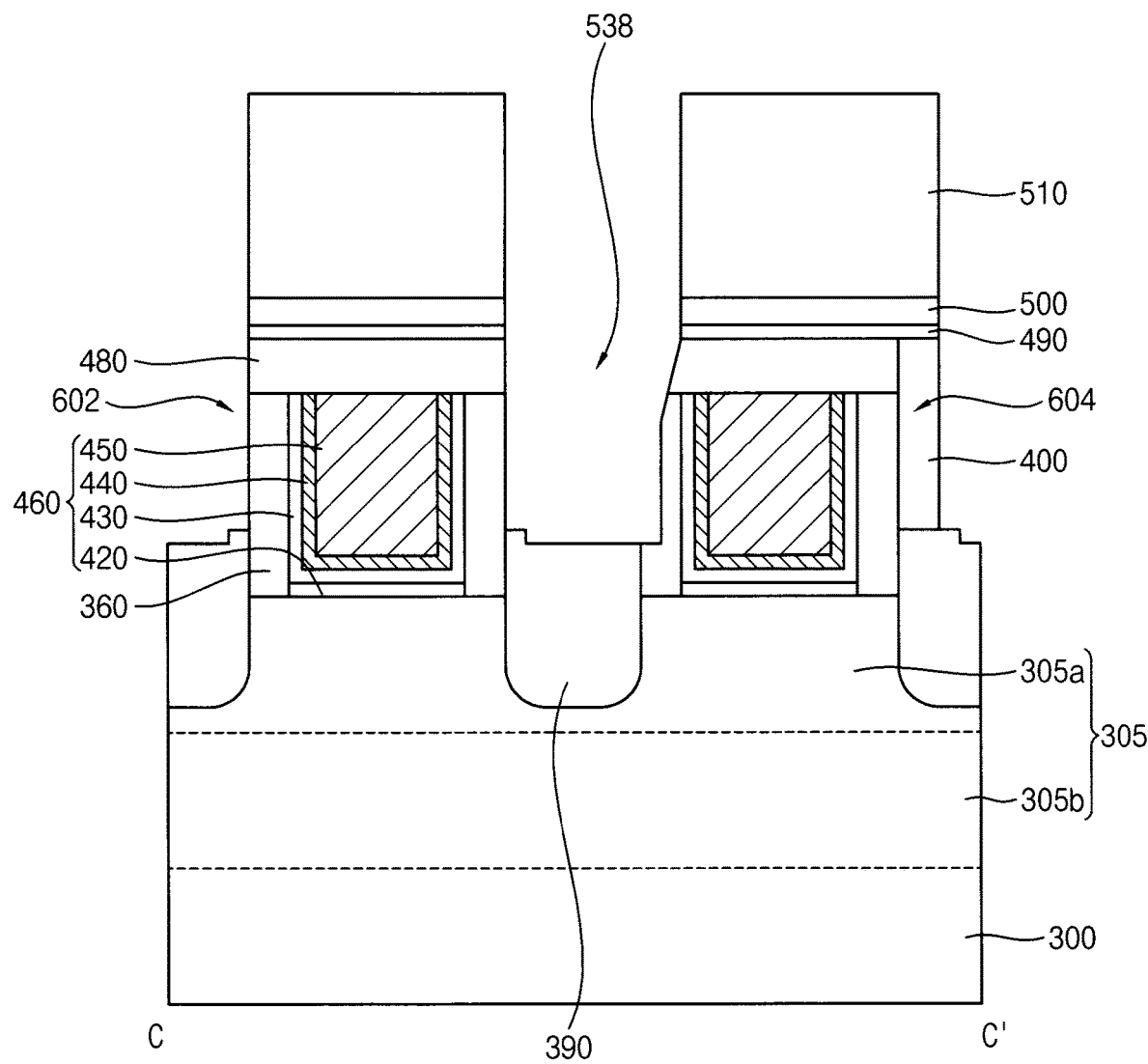
FIG. 26 is a cross-sectional view illustrating a method of manufacturing a semiconductor device according to some embodiments of the present inventive concept.

FIG. 26 is a cross-sectional view illustrating a method of manufacturing a semiconductor device according to example embodiments. FIG. 26 is a cross-sectional view taken along line C-C' of FIG. 1.

A method of manufacturing a semiconductor may be the same as or similar to that of manufacturing the semiconductor device described with reference to FIGS. 5 to 24 and 1 to 4. Thus, detailed descriptions thereof are omitted.

Referring to FIG. 26, processes that are the same as or similar to those described with reference to FIGS. 5 to 23 may be performed to form the sixth opening 538.

However, unlike the process described with reference to FIG. 23, in the removal process of the sacrificial spacer 540 for forming the sixth opening 538, the exposed first capping pattern 480 and/or the gate spacer 360 of the second gate structure 604 may be partially removed together, such that the sixth opening 538 may have a sloped sidewall in the predetermined range.

Thereafter, processes that are the same as or similar to those described with reference to FIGS. 24 and 1 to 4 may be performed to complete the semiconductor device.

Figure 27:
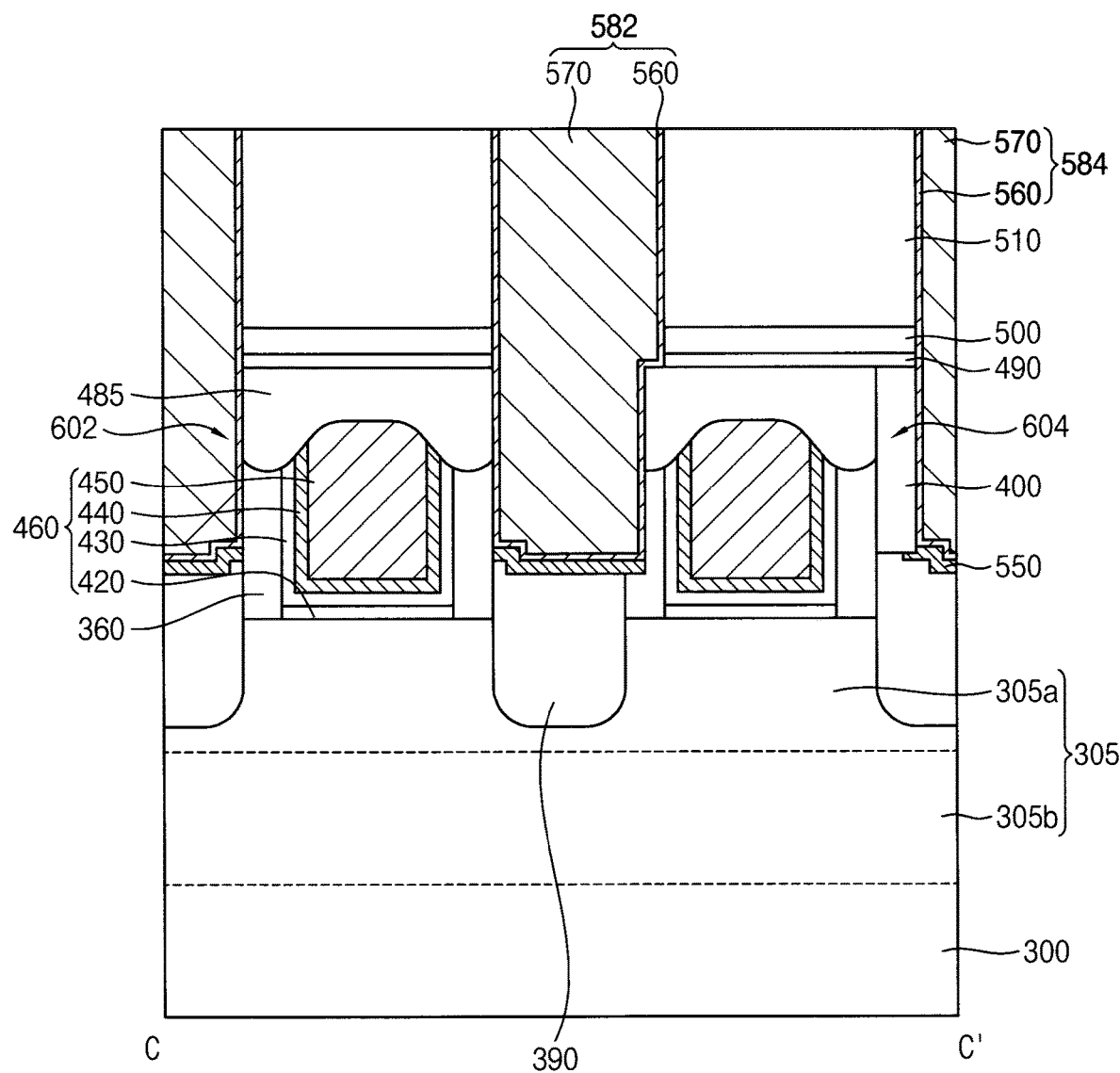
FIG. 27 is a cross-sectional view illustrating a semiconductor device according to some embodiments of the present inventive concept.

FIG. 27 is a cross-sectional view illustrating a semiconductor device according to example embodiments. FIG. 27 is a cross-sectional view taken along line C-C' of FIG. 1.

A semiconductor may be the same as or similar to the semiconductor device described with reference to FIGS. 1 to 4, except for a shape of the capping pattern. Thus, detailed descriptions thereof are omitted.

Referring to FIG. 27, each of the gate structures may include a second capping pattern 485 with a curved lower surface instead of the first capping pattern 480 with the flat lower surface.

Specifically, a middle lower surface of the second capping pattern 485 may have a relative high position, and an edge lower surface thereof may have a relatively lower position and may have a downward convex curved shape. Thus, a spaced distance between the gate electrode structure 460 and the first contact plug 582 may be increased, such that the electrical short therebetween may be reduced or prevented.

Figure 28:
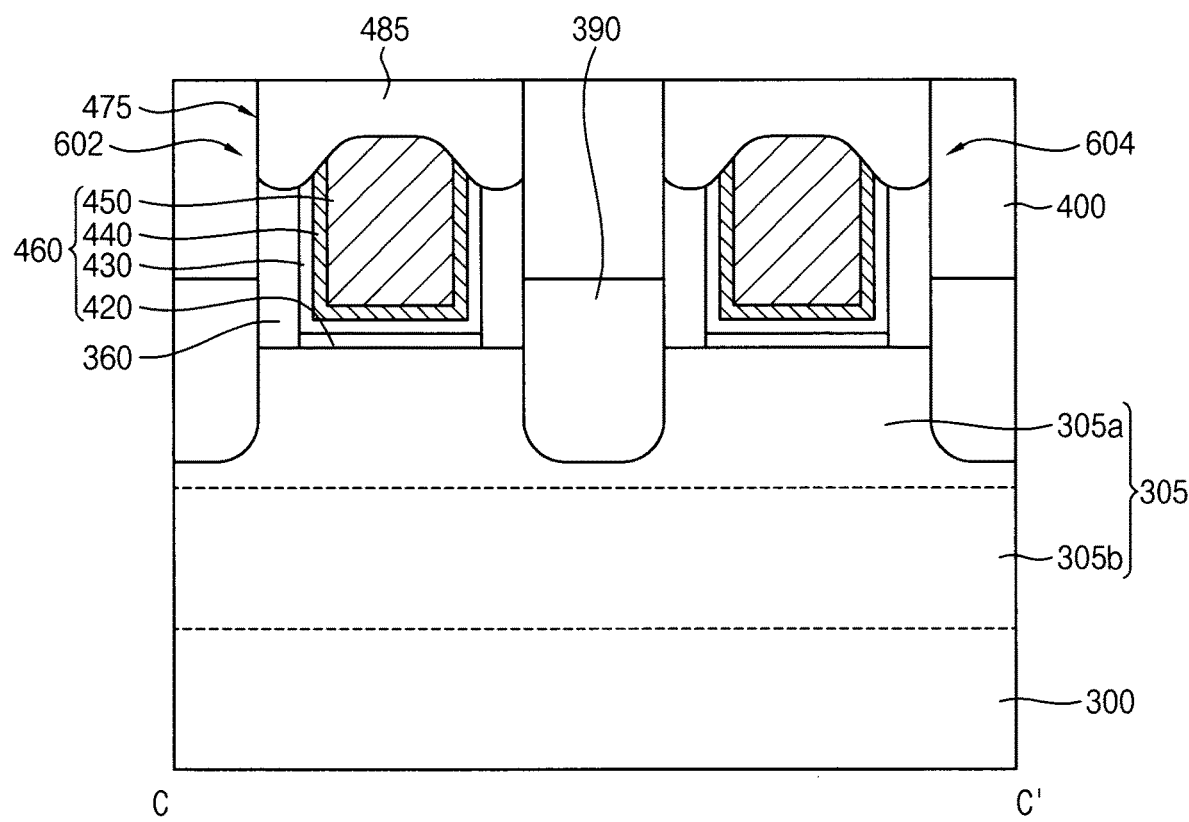
FIG. 28 is a cross-sectional view illustrating a method of manufacturing a semiconductor device according to some embodiments of the present inventive concept.

FIG. 28 is a cross-sectional view illustrating a method of manufacturing semiconductor device according to example embodiments. FIG. 28 is a cross-sectional view taken along line C-C' of FIG. 1.

A method of manufacturing a semiconductor may be the same as or similar to that of manufacturing the semiconductor device described with reference to FIGS. 5 to 24 and 1 to 4. Thus, detailed descriptions thereof are omitted.

Referring to FIG. 28, processes that are the same as or similar to those described with reference to FIGS. 5 to 18 may performed.

However, in the process described with reference to FIG. 18, the upper portions of the gate electrode structure 460 and the gate spacer 360 may be removed to form the third recess 470, and then an additional etch process may be performed on the gate electrode structure 460 and the gate spacer 360 exposed by the third recess 470 to form a fourth recess 475 having an edge bottom surface that is downwardly convex. Accordingly, a portion of an upper surface or an edge upper surface of the gate electrode structure 460 may be downwardly convex.

Thereafter, the second capping pattern 485 may be formed to fill the fourth recess 475, and processes that are the same as or similar to those described with reference to FIGS. 19 to 24 and 1 to 4 may be performed to complete the semiconductor device.

Figure 29:
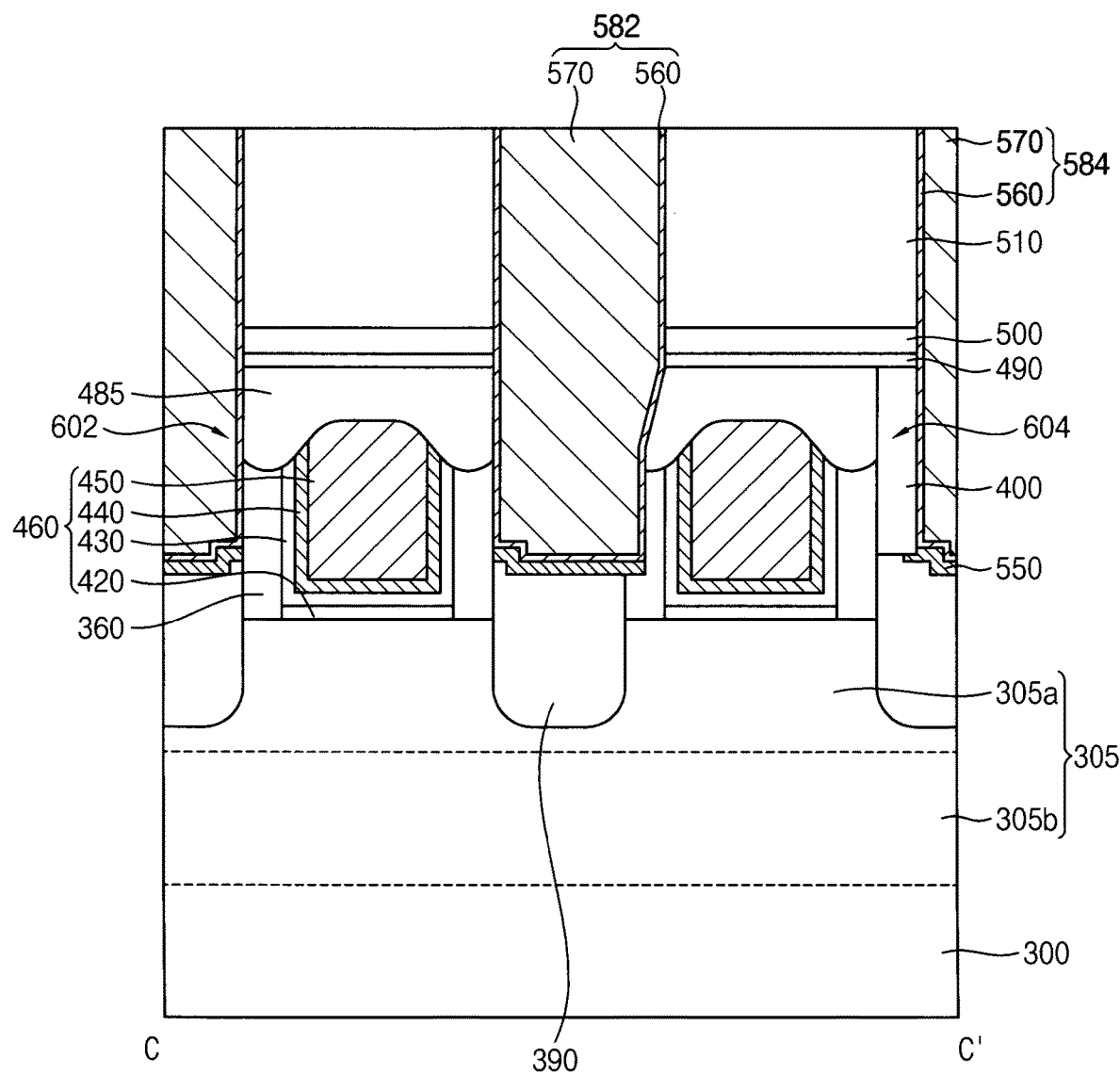
FIG. 29 is a cross-sectional view illustrating a semiconductor device according to some embodiments of the present inventive concept.

FIG. 29 is a cross-sectional view illustrating a semiconductor device according to example embodiments. FIG. 29 is a cross-sectional view taken along line C-C' of FIG. 1.

Referring to FIG. 29, a semiconductor device may have the shape of the first contact plug 582 of the semiconductor device described with reference to FIG. 25 and may include the second capping pattern 485 of the semiconductor device described with reference to FIG. 27.

Figure 30:
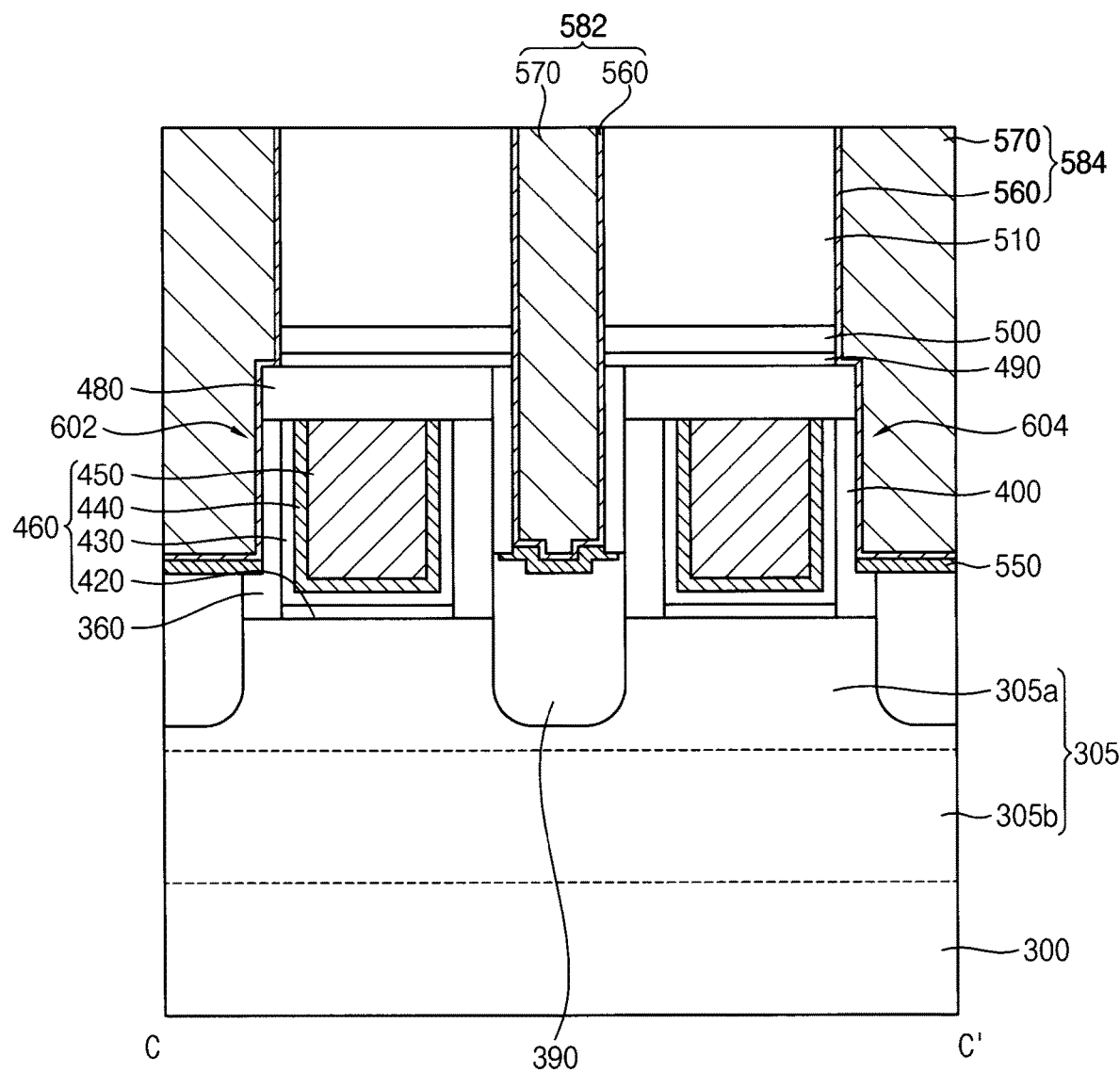
FIGS. 30 and 31 are cross-sectional views illustrating a semiconductor device according to some embodiments of the present inventive concept.
Figure 31:
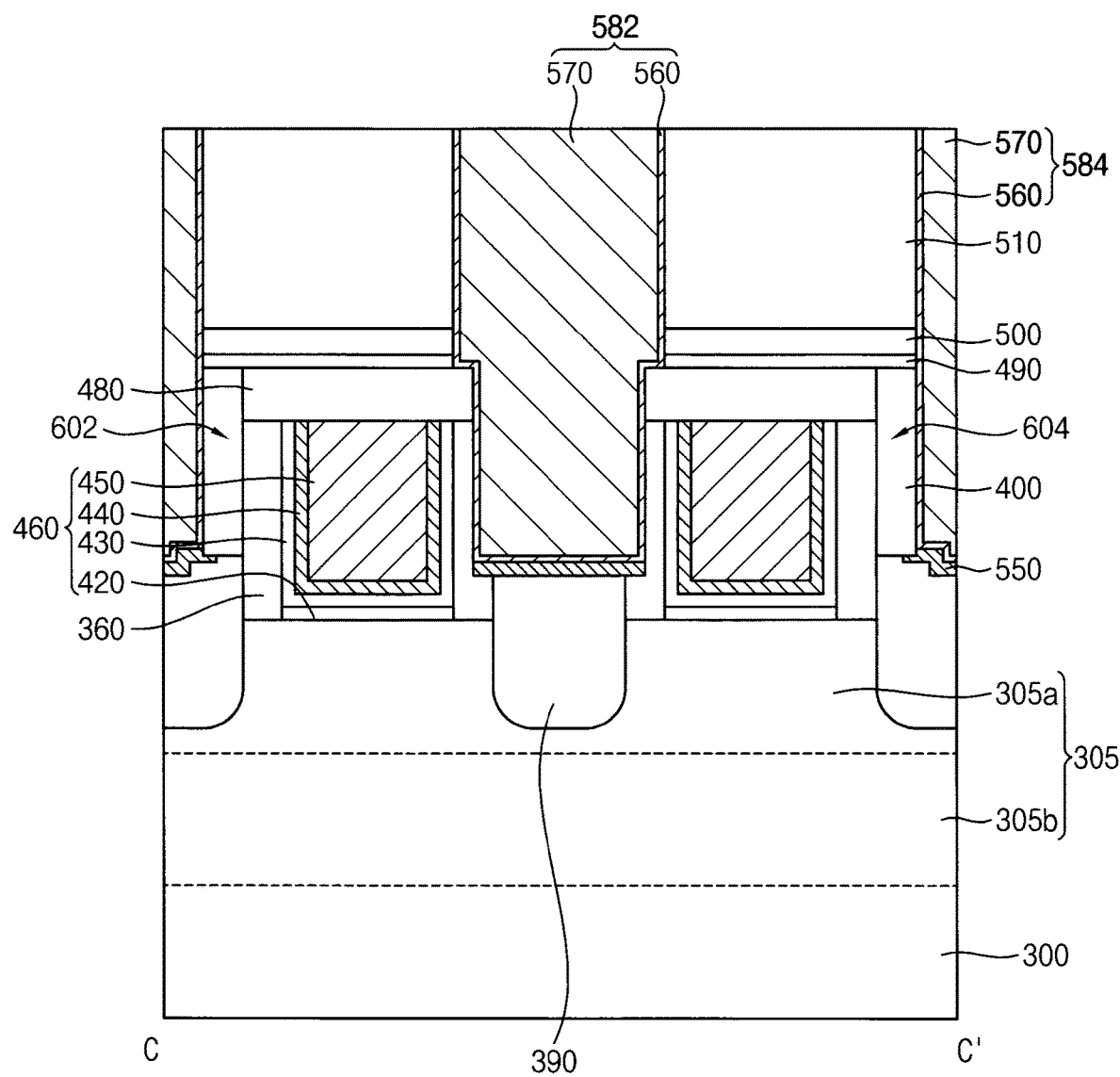

FIGS. 30 and 31 are cross-sectional views illustrating a semiconductor device according to example embodiments. FIGS. 30 and 31 are cross-sectional views taken along line C-C' of FIG. 1.

Referring to FIG. 30, in the case in which the etch masks used in the etch process for forming the contact plugs are offset in a direction toward a space between the first and second gate structures 602 and 604, a semiconductor device may include the contact plugs formed by formation of the sacrificial spacer according to example embodiments.

Thus, the first contact plug 582 may not contact the sidewalls of the first and second gate structures 602 and 604, and the first interlayer insulation layer 400 may remain between the first contact plug 582 and the first gate structure 602 and between the first contact plug 582 and the second gate structure 604. A sidewall of the second contact plug 584 may contact another sidewall of the second gate structure 604, and thus the sidewall of the second contact plug 584 may be bent at the height level of the upper surface of the second gate structure 604.

Referring to FIG. 31, in the case in which the etch masks are offset in a reverse direction to that described with reference to FIG. 30 a semiconductor device may include the contact plugs formed by formation of the sacrificial spacer according to example embodiments.

The first contact plug 582 may contact the sidewalls of the first and second gate structures 602 and 604, and opposite sidewalls of the first contact plug 582 may be bent at the height level of the upper surfaces of the first and second gate structures 602 and 604.

The second contact plug 584 may not contact another sidewall of the second gate structure 604, and the first interlayer insulation layer 400 may remain between the second contact plug 584 and the second gate structure 604.

The aforementioned semiconductor device may be embodied in various memory devices and systems including a contact plug. For example, the semiconductor device may be embodied in the contact plug included in a logic device, e.g., a central processor unit (CPU), a microprocessor unit (MPU), or an application processor (AP), or in a memory peripheral region or a cell region of a volatile memory device, e.g., a DRAM or an SRAM, or of a nonvolatile memory device, e.g., a flash memory, a PRAM, an MRAM, or an RRAM.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
   a substrate;
   a gate structure on the substrate, wherein the gate structure comprises a gate electrode;
   a source/drain layer on the substrate adjacent the gate structure;
   a first etch stop layer, a second etch stop layer, and interlayer insulation layer that are stacked on an upper surface of the gate electrode that is opposite the substrate; and
   a contact plug penetrating the interlayer insulation layer, the second etch stop layer, and the first etch stop layer,
   wherein the contact plug contacts a sidewall of the gate structure,
   wherein the contact plug comprises a lower portion having a first width and an upper portion having a second width that is greater than the first width,
   wherein the contact plug comprises a barrier pattern that extends on first and second side surfaces of the contact plug and on a lower surface of the contact plug, the lower surface of the contact plug is lower than the first side surface of the contact plug,
   wherein the barrier pattern contacts the interlayer insulation layer, the second etch stop layer, and the first etch stop layer,
   wherein a first portion of the lower surface of the contact plug directly adjacent the first side surface has a first stepped shape and the second side surface of the contact plug comprises a second stepped shape,
   wherein a second portion of the lower surface of the contact plug directly adjacent the second side surface is substantially flat, and
   wherein a portion of an upper surface of the source/drain layer under the first stepped shape of the lower surface of the contact plug protrudes upwardly from other portions of the upper surface of the source/drain layer.

2. The device of claim 1,
   wherein the contact plug comprises a first sidewall and a second sidewall that is opposite the first sidewall,
   wherein the lower portion of the contact plug is positioned below a height level of an upper surface of the gate structure,
   wherein the upper portion of the contact plug is positioned equal to or above the height level of the upper surface of the gate structure, and
   wherein the first sidewall of the contact plug is bent at the height level of the upper surface of the gate structure.

3. The device of claim 2, wherein the second sidewall of the contact plug has a constant slope with respect to an upper surface of the substrate.

4. The device of claim 1,
   wherein the contact plug comprises a first sidewall and a second sidewall that is opposite the first sidewall,
   wherein the lower portion of the contact plug is positioned below a height level of an upper surface of the gate structure,
   wherein the upper portion of the contact plug is positioned equal to or above the height level of the upper surface of the gate structure,
   wherein the first sidewall of the contact plug comprises a sloped portion with respect to an upper surface of the substrate, and
   wherein the sloped portion is below the height level of the upper surface of the gate structure.

5. The device of claim 1, wherein the first and second etch stop layers comprise different materials.

6. The device of claim 1, wherein the gate structure comprises:
   a gate insulation pattern on a sidewall of the gate electrode and a lower surface of the gate electrode;
   a gate spacer on a sidewall of the gate insulation pattern; and
   a capping pattern on the gate electrode, the gate insulation pattern, and the gate spacer.

7. The device of claim 6, wherein a lower surface of the capping pattern is curved.

8. The device of claim 6, wherein a portion of an upper surface of the capping pattern contacts a lower sidewall of the upper portion of the contact plug.

9. The device of claim 1, further comprising:
   a source/drain layer on the substrate adjacent to the gate structure,
   wherein the contact plug vertically overlaps the source/drain layer.

10. The device of claim 9, further comprising:
    a metal silicide pattern between an upper surface of the source/drain layer and the lower surface of the contact plug,
    wherein an upper surface of the metal silicide pattern has a shape corresponding to a shape of the lower surface of the contact plug.

11. The device of claim 1, wherein the gate structure comprises a plurality of gate structures spaced apart from each other in a first direction parallel to an upper surface of the substrate, and
wherein the contact plug contacts facing sidewalls of adjacent gate structures of ones of the plurality of the gate structures.

12. The device of claim 11, further comprising:
a plurality of active fins on the substrate,
wherein each of the plurality of active fins extends in the first direction, and
wherein each of the plurality of gate structures is on the plurality of active fins and extends in a second direction crossing the first direction.

13. A semiconductor device comprising:
a substrate;
a gate structure on the substrate, wherein the gate structure comprises a gate electrode;
a first source/drain layer and a second source/drain layer on the substrate adjacent to a first sidewall of the gate structure and a second sidewall of the gate structure, respectively;
a first interlayer insulation layer on the substrate and the first and second source/drain layers;
a first etch stop layer, a second etch stop layer, and a second interlayer insulation layer that are sequentially stacked on an upper surface of the gate electrode that is opposite the substrate and the first interlayer insulation layer; and
a first contact plug and a second contact plug on the first source/drain layer and the second source/drain layer, respectively, and penetrating the second interlayer insulation layer, the second etch stop layer, the first etch stop layer, and the first interlayer insulation layer,
wherein the first contact plug directly contacts the first sidewall of the gate structure and a portion of an upper surface of the gate structure adjacent to the first sidewall of the gate structure,
wherein the second contact plug is spaced apart from the second sidewall of the gate structure by the first interlayer insulation layer,
wherein the second contact plug includes a side surface and a lower surface that is lower than the side surface,
wherein a portion of the lower surface of the second contact plug directly adjacent the gate structure has a first stepped shape,
wherein a side surface of the first contact plug directly adjacent the gate structure comprises a second stepped shape that is spaced apart from a lower surface of the first contact plug,
wherein a portion of the lower surface of the first contact plug directly adjacent the first sidewall of the gate structure is substantially flat, and
wherein a portion of an upper surface of the second source/drain layer under the first stepped shape of the lower surface of the second contact plug protrudes upwardly from other portions of the upper surface of the source/drain layer.

14. The device of claim 13,
wherein the first contact plug comprises a lower portion having a first width and an upper portion having a second width greater than the first width,
wherein a lower sidewall of the upper portion of the first contact plug contacts the portion of the upper surface of the gate structure, and
wherein the first contact plug has a lower surface having a stepped shape.

15. The device of claim 13,
wherein the first source/drain layer and the second source/drain layer are merged together, and
wherein the first interlayer insulation layer does not completely fill a space between the first source/drain layer and the second source/drain layer that are merged together and a device isolation pattern.

16. The device of claim 13, further comprising:
a first metal silicide pattern between the first source/drain layer and the first contact plug; and
a second metal silicide pattern between the second source/drain layer and the second contact plug,
wherein the first metal silicide pattern has an upper surface having a stepped shape, and
wherein the second metal silicide pattern is between the second source/drain layer and the first interlayer insulation layer adjacent to the second contact plug.

17. The device of claim 13, wherein the gate structure comprises:
a gate electrode;
a gate insulation pattern on a sidewall of the gate electrode and a lower surface of the gate electrode;
a gate spacer on a sidewall of the gate insulation pattern; and
a capping pattern on the gate electrode, the gate insulation pattern, and the gate spacer,
wherein a lower surface of the capping pattern is curved.

18. A semiconductor device comprising:
a substrate;
a first gate structure and a second gate structure on the substrate, wherein each of the first gate structure and the second gate structure comprises:
a gate electrode;
a gate insulation pattern on a sidewall of the gate electrode and a lower surface of the gate electrode;
a gate spacer on a sidewall of the gate insulation pattern; and
a capping pattern on the gate electrode, the gate insulation pattern, and the gate spacer;
a source/drain layer on the substrate between the first gate structure and the second gate structure;
a first etch stop layer on the capping pattern; and
a contact plug on the source/drain layer,
wherein the contact plug contacts a sidewall of the gate spacer of the first gate structure, a sidewall and a portion of an upper surface of the capping pattern of the first gate structure, a sidewall of the gate spacer of the second gate structure, and a sidewall of the capping pattern of the second gate structure,
wherein the contact plug includes a lower portion having a first width and an upper portion having a second width that is greater than the first width, the contact plug includes first and second side surfaces and a lower surface that is lower than the first side surface and a portion of the lower surface of the lower portion of the contact plug has a first stepped shape directly adjacent the first side surface of the contact plug and at a height lower than that of a lower surface of the capping pattern,
wherein the second side surface of the contact plug has a second stepped shape at an interface between the lower portion having the first width and the upper portion having the second width,
wherein the second stepped shape is at a same height as a lower surface of the first etch stop layer and is higher than the first stepped shape, relative to the substrate, wherein a portion of the lower surface of the lower portion of the contact plug directly adjacent the second side surface of the contact plug is substantially flat, and wherein a portion of an upper surface of the source/drain layer under the first stepped shape of the lower surface of the lower portion of the contact plug protrudes upwardly from other portions of the upper surface of the source/drain layer.

19. The device of claim 18, further comprising:

a second etch stop layer and an interlayer insulation layer that are sequentially stacked on the first gate structure and the second gate structure, wherein the contact plug penetrates the interlayer insulation layer, the second etch stop layer, and the first etch stop layer.

20. The device of claim 19, wherein the gate spacer, the capping pattern, and the second etch stop layer comprise nitride, and wherein the first etch stop layer and the interlayer insulation layer comprise oxide.

* * * * *